United States Patent
Kayes et al.

(10) Patent No.: US 11,271,128 B2
(45) Date of Patent: Mar. 8, 2022

(54) MULTI-JUNCTION OPTOELECTRONIC DEVICE

(71) Applicant: UTICA LEASECO, LLC, Rochester Hills, MI (US)

(72) Inventors: Brendan M. Kayes, San Francisco, CA (US); Gang He, Cupertino, CA (US); Sylvia Spruytte, Palo Alto, CA (US); I-Kang Ding, Sunnyvale, CA (US); Gregg Higashi, San Jose, CA (US)

(73) Assignee: UTICA LEASECO, LLC, Rochester Hills, MI (US)

( * ) Notice: Subject to any disclaimer, the term of this patent is extended or adjusted under 35 U.S.C. 154(b) by 92 days.

(21) Appl. No.: 15/706,090

(22) Filed: Sep. 15, 2017

(65) Prior Publication Data

US 2018/0019359 A1   Jan. 18, 2018

Related U.S. Application Data

(63) Continuation-in-part of application No. 13/705,064, filed on Dec. 4, 2012, now Pat. No. 9,768,329, which
(Continued)

(51) Int. Cl.
*H01L 31/0725* (2012.01)
*H01L 31/18* (2006.01)
(Continued)

(52) U.S. Cl.
CPC ...... *H01L 31/0725* (2013.01); *H01L 31/0236* (2013.01); *H01L 31/02167* (2013.01);
(Continued)

(58) Field of Classification Search
None
See application file for complete search history.

(56) References Cited

U.S. PATENT DOCUMENTS 3,615,853 A   10/1971   Paine et al.
3,838,359 A    9/1974   Hakki et al.
(Continued)

FOREIGN PATENT DOCUMENTS

CN    1574388       2/2005
CN    102007582 A   4/2011
(Continued)

OTHER PUBLICATIONS

Chinese Office Action (with Full English Translation) dated Oct. 15, 2018 issued in corresponding Chinese Application No. 201610836332.2.

(Continued)

*Primary Examiner* — Abul Kalam
(74) *Attorney, Agent, or Firm* — Arent Fox LLP

(57) ABSTRACT

An optoelectronic semiconductor device is disclosed. The device comprises a plurality of stacked p-n junctions (e.g., multi junction device). The optoelectronic semiconductor device includes a n-doped layer disposed below the p-doped layer to form a p-n layer such that electric energy is created when photons are absorbed by the p-n layer. Recesses are formed on top of the p-doped layer at the top of the plurality of stacked p-n junctions. The junctions create an offset and an interface layer is formed on top of the p-doped layer at the top of the plurality stacked p-n junctions. The device also includes a window layer disposed below the plurality stacked p-n junctions. In another aspect, one or more optical filters are inserted into a device to enhance its efficiency through photon recycling. The device can be fabricated by epitaxial growth on a substrate and removed from the substrate through a lift off process.

14 Claims, 12 Drawing Sheets

Related U.S. Application Data is a continuation-in-part of application No. 12/939,077, filed on Nov. 3, 2010, now abandoned, and a continuation-in-part of application No. 12/605,108, filed on Oct. 23, 2009, now Pat. No. 8,937,244.

(51) Int. Cl.

| | | |
|---|---|---|
| *H01L 31/0236* | (2006.01) | |
| *H01L 31/0232* | (2014.01) | |
| *H01L 31/0216* | (2014.01) | |
| *H01L 31/0735* | (2012.01) | |
| *H01L 31/0224* | (2006.01) | |
| *H01L 31/055* | (2014.01) | |

(52) U.S. Cl.
CPC .. *H01L 31/02327* (2013.01); *H01L 31/02363* (2013.01); *H01L 31/022441* (2013.01); *H01L 31/055* (2013.01); *H01L 31/0735* (2013.01); *H01L 31/184* (2013.01); *H01L 31/1844* (2013.01); *H01L 31/1892* (2013.01); *H01L 31/1896* (2013.01); *Y02E 10/544* (2013.01)

(56) References Cited

U.S. PATENT DOCUMENTS

| | | |
|---|---|---|
| 3,990,101 A | 11/1976 | Ettenberg et al. |
| 4,015,280 A | 3/1977 | Matsushita et al. |
| 4,017,332 A | 4/1977 | James |
| 4,094,704 A | 6/1978 | Milnes et al. |
| 4,107,723 A | 8/1978 | Kamath |
| 4,191,593 A | 3/1980 | Cacheux |
| 4,197,141 A | 4/1980 | Bozler et al. |
| 4,295,002 A | 10/1981 | Chappell et al. |
| 4,338,480 A | 7/1982 | Antypas et al. |
| 4,385,198 A | 5/1983 | Rahilly |
| 4,400,221 A | 8/1983 | Rahilly |
| 4,410,758 A | 10/1983 | Grolitzer |
| 4,419,533 A | 12/1983 | Czubatyj et al. |
| 4,444,992 A | 4/1984 | Cox, III |
| 4,479,027 A | 10/1984 | Todorof |
| 4,497,974 A | 2/1985 | Deckman et al. |
| 4,543,441 A | 9/1985 | Kumada et al. |
| 4,571,448 A | 2/1986 | Barnett |
| 4,582,952 A | 4/1986 | McNeely et al. |
| 4,633,030 A | 12/1986 | Cook |
| 4,667,059 A | 5/1987 | Olson |
| 4,773,945 A | 9/1988 | Woolf et al. |
| 4,775,639 A | 10/1988 | Yoshida |
| 4,889,656 A | 12/1989 | Flynn et al. |
| 4,916,503 A | 4/1990 | Uematsu et al. |
| 4,989,059 A | 1/1991 | Micheels et al. |
| 4,997,491 A | 3/1991 | Hokuyo et al. |
| 5,101,260 A | 3/1992 | Nath et al. |
| 5,103,268 A | 4/1992 | Yin et al. |
| 5,116,427 A | 5/1992 | Fan et al. |
| 5,136,351 A | 8/1992 | Inoue et al. |
| 5,217,539 A | 6/1993 | Fraas et al. |
| 5,223,043 A | 6/1993 | Olson et al. |
| 5,230,746 A | 7/1993 | Wiedeman et al. |
| 5,231,931 A | 8/1993 | Sauvageot et al. |
| 5,316,593 A | 5/1994 | Olson et al. |
| 5,330,585 A | 7/1994 | Chang et al. |
| 5,342,453 A | 8/1994 | Olson |
| 5,356,488 A | 10/1994 | Hezel |
| 5,376,185 A | 12/1994 | Wanlass |
| 5,385,960 A | 1/1995 | Emmons et al. |
| 5,465,009 A | 11/1995 | Drabik et al. |
| 5,468,652 A | 11/1995 | Gee |
| 6,107,563 A | 8/2000 | Nakanishi et al. |
| 6,166,218 A | 12/2000 | Ravichandran |
| 6,166,318 A | 12/2000 | Freeouf |
| 6,229,084 B1 | 5/2001 | Katsu |
| 6,231,931 B1 | 5/2001 | Blazey et al. |
| 6,255,580 B1 | 7/2001 | Karam et al. |
| 6,372,981 B1* | 4/2002 | Ueda ................ C30B 25/02 |
| | | 117/101 |
| 6,452,091 B1 | 9/2002 | Nakagawa et al. |
| 6,534,336 B1 | 3/2003 | Iwane et al. |
| 6,617,508 B2 | 9/2003 | Kilmer et al. |
| 7,038,250 B2 | 5/2006 | Sugiyama et al. |
| 7,875,945 B2 | 1/2011 | Krasnov et al. |
| 8,183,081 B2 | 5/2012 | Weidman et al. |
| 8,258,596 B2 | 9/2012 | Nasuno et al. |
| 8,664,515 B2 | 3/2014 | Hong et al. |
| 8,697,553 B2 | 4/2014 | Adibi et al. |
| 8,895,845 B2 | 11/2014 | Kizilyalli et al. |
| 8,895,846 B2 | 11/2014 | Kizilyalli et al. |
| 8,937,244 B2 | 1/2015 | Kizilyalli et al. |
| 8,993,873 B2 | 3/2015 | Youtsey et al. |
| 9,099,595 B2 | 8/2015 | King et al. |
| 9,136,418 B2 | 9/2015 | Nie et al. |
| 9,136,422 B1 | 9/2015 | Higashi et al. |
| 9,178,099 B2 | 11/2015 | Nie et al. |
| 9,502,594 B2 | 11/2016 | Ding et al. |
| 9,537,025 B1 | 1/2017 | Higashi et al. |
| 9,691,921 B2 | 6/2017 | Atwater et al. |
| 9,768,329 B1 | 9/2017 | Kayes et al. |
| 2001/0027805 A1 | 10/2001 | Ho et al. |
| 2002/0000244 A1 | 1/2002 | Zaidi |
| 2002/0053683 A1 | 5/2002 | Hill et al. |
| 2002/0144724 A1 | 10/2002 | Kilmer et al. |
| 2002/0179141 A1 | 12/2002 | Ho et al. |
| 2003/0070707 A1 | 4/2003 | King et al. |
| 2003/0140962 A1 | 7/2003 | Sharps et al. |
| 2003/0222278 A1 | 12/2003 | Liu et al. |
| 2004/0112426 A1 | 6/2004 | Hagino |
| 2004/0166681 A1 | 8/2004 | Iles et al. |
| 2004/0200523 A1 | 10/2004 | King et al. |
| 2005/0001233 A1 | 1/2005 | Sugiyama et al. |
| 2005/0022863 A1 | 2/2005 | Agostinelli et al. |
| 2006/0081963 A1 | 4/2006 | Render et al. |
| 2006/0090790 A1 | 5/2006 | Kobayashi et al. |
| 2006/0144435 A1 | 7/2006 | Wanlass |
| 2006/0162767 A1 | 7/2006 | Mascarenhas et al. |
| 2006/0207651 A1 | 9/2006 | Posthuma et al. |
| 2006/0255340 A1 | 11/2006 | Manivannan et al. |
| 2007/0131275 A1 | 6/2007 | Kinsey et al. |
| 2007/0137695 A1 | 6/2007 | Fetzer et al. |
| 2007/0137698 A1 | 6/2007 | Wanlass et al. |
| 2007/0151596 A1 | 7/2007 | Nasuno et al. |
| 2007/0166862 A1 | 7/2007 | Kim et al. |
| 2007/0199591 A1 | 8/2007 | Harder et al. |
| 2007/0235074 A1 | 10/2007 | Henley et al. |
| 2007/0277874 A1 | 12/2007 | Dawson-Elli et al. |
| 2008/0128020 A1 | 6/2008 | Zafar et al. |
| 2008/0245409 A1 | 10/2008 | Varghese et al. |
| 2009/0151784 A1 | 6/2009 | Luan et al. |
| 2009/0283802 A1 | 11/2009 | Henderson et al. |
| 2009/0288703 A1 | 11/2009 | Stan et al. |
| 2010/0006143 A1 | 1/2010 | Welser |
| 2010/0015751 A1 | 1/2010 | Weidman et al. |
| 2010/0047959 A1 | 2/2010 | Cornfeld et al. |
| 2010/0055397 A1 | 3/2010 | Kurihara et al. |
| 2010/0065117 A1 | 3/2010 | Kim et al. |
| 2010/0089443 A1 | 4/2010 | Bloomstein et al. |
| 2010/0096010 A1 | 4/2010 | Welser |
| 2010/0126552 A1 | 5/2010 | Kizilyalli et al. |
| 2010/0126570 A1 | 5/2010 | Kizilyalli et al. |
| 2010/0126571 A1 | 5/2010 | Kizilyalli et al. |
| 2010/0126572 A1 | 5/2010 | Kizilyalli et al. |
| 2010/0132774 A1 | 6/2010 | Borden |
| 2010/0132780 A1 | 6/2010 | Kizilyalli et al. |
| 2010/0193002 A1 | 8/2010 | Dimroth et al. |
| 2010/0218819 A1 | 9/2010 | Farmer et al. |
| 2010/0270653 A1 | 10/2010 | Leitz et al. |
| 2010/0294349 A1 | 11/2010 | Srinivasan et al. |
| 2010/0294356 A1 | 11/2010 | Parikh et al. |
| 2011/0083722 A1 | 4/2011 | Atwater et al. |
| 2011/0088771 A1 | 4/2011 | Lin et al. |
| 2011/0108098 A1 | 5/2011 | Kapur |
| 2011/0156000 A1 | 6/2011 | Cheng |
| 2011/0189817 A1 | 8/2011 | Takahashi et al. |
| 2011/0214728 A1 | 9/2011 | Veerasamy |

(56) References Cited

U.S. PATENT DOCUMENTS

| | | | |
|---|---|---|---|
| 2011/0244692 A1 | 10/2011 | Jeong et al. | |
| 2011/0290322 A1 | 12/2011 | Meguro et al. | |
| 2012/0024336 A1 | 2/2012 | Hwang | |
| 2012/0031478 A1 | 2/2012 | Boisvert et al. | |
| 2012/0055541 A1 | 3/2012 | Granek et al. | |
| 2012/0067423 A1 | 3/2012 | Lochtefeld et al. | |
| 2012/0104411 A1 | 5/2012 | Iza et al. | |
| 2012/0125256 A1 | 5/2012 | Kramer et al. | |
| 2012/0132930 A1 | 5/2012 | Young et al. | |
| 2012/0160296 A1 | 6/2012 | Laparra et al. | |
| 2012/0164796 A1 | 6/2012 | Lowenthal et al. | |
| 2012/0227805 A1 | 9/2012 | Hermle et al. | |
| 2012/0247555 A1 | 10/2012 | Matsushita et al. | |
| 2012/0305059 A1 | 12/2012 | Kayes et al. | |
| 2013/0025654 A1 | 1/2013 | Bedell et al. | |
| 2013/0026481 A1 | 1/2013 | Xu et al. | |
| 2013/0112258 A1 | 5/2013 | Park et al. | |
| 2013/0180578 A1* | 7/2013 | Ravi | H01L 31/02242 136/255 |
| 2013/0220396 A1 | 8/2013 | Janssen et al. | |
| 2013/0270589 A1 | 10/2013 | Kayes et al. | |
| 2013/0288418 A1 | 10/2013 | Wang et al. | |
| 2013/0337601 A1 | 12/2013 | Kapur et al. | |
| 2014/0076386 A1 | 3/2014 | King et al. | |
| 2014/0216543 A1* | 8/2014 | Sugimoto | H01L 31/02244 136/256 |
| 2014/0261611 A1* | 9/2014 | King | H01L 31/0352 136/244 |
| 2014/0312373 A1 | 10/2014 | Donofrio | |
| 2015/0034152 A1* | 2/2015 | Cornfeld | H01L 31/02167 136/255 |
| 2015/0171261 A1 | 6/2015 | Domine | |
| 2015/0228835 A1 | 8/2015 | Kayes et al. | |
| 2015/0368833 A1 | 12/2015 | Farah | |
| 2015/0380576 A1 | 12/2015 | Kayes et al. | |
| 2016/0155881 A1 | 6/2016 | France et al. | |
| 2017/0047471 A1 | 2/2017 | Ding et al. | |
| 2017/0141256 A1 | 5/2017 | Kayes et al. | |
| 2017/0148930 A1 | 5/2017 | Hu et al. | |

FOREIGN PATENT DOCUMENTS

| | | |
|---|---|---|
| CN | 102473743 A | 5/2012 |
| CN | 103952768 A | 7/2014 |
| EP | 0595634 | 5/1994 |
| EP | 2927968 A1 | 10/2015 |
| GB | 2501432 A | 10/2013 |
| JP | 63211775 | 9/1988 |
| JP | 3285368 | 12/1991 |
| JP | 06244443 | 9/1994 |
| JP | 07007148 | 1/1995 |
| JP | 8130321 | 5/1996 |
| JP | H09213206 A | 8/1997 |
| KR | 100762772 | 10/2007 |
| WO | WO 02065553 | 8/2002 |
| WO | WO 2008100603 | 8/2008 |
| WO | 2009044171 A2 | 4/2009 |
| WO | 2016123074 A1 | 8/2016 |

OTHER PUBLICATIONS

Chinese Office Action issued in Chinese Patent Application No. 201110329046.4 dated Jun. 23, 2016.

Non-Final Office Action issued in U.S. Appl. No. 14/692,647 dated May 11, 2017.

Aisaka et al. "Enhancement of upconversion Luminescence of Er Doped Al2O3 Films by Ag Islands Films" (Apr. 1, 2008) Applied Physics Letters 92, 132105, pp. 1-3.

Biteen et al. "Spectral Tuning of Plasmon-enhanced Silicon Quantum Dot Luminescence" (Mar. 31, 2006) Applied Physics Letters 88, 131109, pp. 1-3.

Dionne et al. "Highly Confined Photon Transport in Subwavelength Metallic Slot Waveguides" (Jun. 20, 2006) Nano Lett., vol. 6, No. 9, pp. 1928-1932.

Floyd et al. "An N—AlGaAs P—GaAs Graded Heterojunction for High Concentration Ratios" IEEE, 1987, pp. 81-86.

Lewis et al. "Pigment Handbook vol. I: Properties and Economics, 2nd Edition" 1988, pp. 790-791, John Wiley & Sons, New York.

Lezec et al. "Negative Refraction at Visible Frequencies" (Apr. 20, 2007) Science, vol. 316, pp. 430-432.

Nielson et al. "Microfabrication of microsystem-enabled photovoltaic (MEPV) cells." Pro. of the Int. Soc. of Opt. and Photo. (SPIE) [online], (Jan. 25, 2011) Retrieved from the internet: <URL:http://photovoltaics.sandia.gov/Pubs_2010/2011/Microfab_of_MEPV_Cells_SPIE_2011.pdf> See entire document especially Fig. 5, p. 5.

Othaman et al. "The Stranski-Krastanov Three Dimensional Island Growth Prediction on Finite Size Model" (2008) pages 1-5.

Pacifici et al. "Quantitative Determination of Optical Transmission through Subwavelength Slit Arrays in Ag films: The Essential role of Surface Wave Interference and Local Coupling between Adjacent Slits" (Oct. 22, 2007) Thomas J. Watson Lab. of Appl. Phys., pp. 1-4.

Park et al, "Surface Plasmon Enhanced Photoluminescence of Conjugated Polymers" (Apr. 17, 2007) Appl. Phys. Letters 90, 161107, pp. 1-3.

Pillai et al. "Enhanced emission from Si-based Light-emitting Diodes using Surface Plasmons" (Apr. 17, 2006) Applied Physics Letters, 88, 161102, pp. 1-3.

Sanfacon et al. "Analysis of AlGaAs/GaAs Solar Cell Structures by Optical Reflectance Spectroscopy" IEEE Transactions on Electron Devices Feb. 1990, vol. 37, No. 2, pp. 450-454.

Takamoto et al., "Paper-Thin InGaP/GaAs Solar Cells," IEEE PVSC Proceedings, 2006, pp. 1769-1772.

Tanabe et al. "Direct-bonded GaAs/InGaAs Tandem Solar Cell" (Sep. 6, 2006) Appl. Phys. Lett. 89, 102106, pp. 1-3.

Tsatsul'Nikov et al "Volmer-Weber and Stranski-Krastanov InAs—(Al,Ga) As quantum dots emitting at 1.3um" (Dec. 1, 2000) Journal of Applied Physics, vol. 88, No. 11, pp. 6272-6275.

Van Wijngaarden et al. "Direct Imaging of Propagation and Damping of Near-Resonance Surface Plasmon Polaritons using Cathodoluminescence Spectroscopy" (Jun. 1, 2006) Appl. Phys. Lett. 88, 221111, pp. 1-3.

Yamaguchi et al. "Development Status of "Space Solar Sheet"", IEEE PVSC Proceedings, 2008, 3 pages.

Zhang et al. "Effects of Displaced p-n Junction of Heterojunction Bipoloar Transistors" IEEE Transactions on Electron Devices, Nov. 1992, vol. 39, No. 11, pp. 2430-2437.

Office Action issued in Chinese Patent Application No. 201610836332.2 dated Jan. 31, 2018.

Office Action issued in European Patent Application No. 11187659.5 dated Aug. 13, 2018.

Advisory Action dated Apr. 13, 2016 for U.S. Appl. No. 13/446,876 of Kayes, B.M. et al. filed Apr. 13, 2012.

Advisory Action dated Jul. 22, 2011, for U.S. Appl. No. 12/605,108 of Kizilyalli, I.C. et al. filed Nov. 23, 2009.

Corrected Notice of Allowability dated Dec. 9, 2015 for U.S. Appl. No. 14/452,393 of Ding, I.-K. et al. filed Aug. 5, 2014.

Corrected Notice of Allowability dated Jun. 26, 2017 for U.S. Appl. No. 13/705,064 of Kayes, B.M. et al. filed Dec. 4, 2012.

Corrected Notice of Allowability dated May 26, 2017, for U.S. Appl. No. 12/904,047 of Atwater, H. et al. filed Oct. 13, 2010.

Corrected Notice of Allowability dated Apr. 20, 2015 for U.S. Appl. No. 13/451,455 of Nie, H. et al. filed Jul. 19, 2012.

Corrected Notice of Allowability dated Aug. 17, 2015 for U.S. Appl. No. 13/451,455 of Nie, H. et al. filed Jul. 19, 2012.

Corrected Notice of Allowability dated Jun. 29, 2015 for U.S. Appl. No. 13/451,455 of Nie, H. et al. filed Jul. 19, 2012.

European Search Report dated Sep. 19, 2017 for European Patent Application No. 11187659.5, 11 pages.

Ex Parte Quayle Action mailed Nov. 18, 2016 for U.S. Appl. No. 13/705,064 of Kayes, B.M. et al. filed Dec. 4, 2012.

Final Office Action dated Apr. 10, 2014 for U.S. Appl. No. 13/772,043 of Archer, M.J. et al. filed Feb. 20, 2013.

(56) References Cited

OTHER PUBLICATIONS

Final Office Action dated Apr. 20, 2017 for U.S. Appl. No. 13/446,876 of Kayes, B.M. et al. filed Apr. 13, 2012.
Final Office Action dated Apr. 26, 2012 for U.S. Appl. No. 12/605,108 of Kizilyalli, I.C. et al. filed Nov. 23, 2009.
Final Office Action dated Apr. 28, 2011 for U.S. Appl. No. 12/605,108 of Kizilyalli, I.C. et al. filed Nov. 23, 2009.
Final Office Action dated Aug. 14, 2014 for U.S. Appl. No. 13/354,175 of Higashi, G. et al. filed Jan. 19, 2012.
Final Office Action dated Feb. 1, 2016 for U.S. Appl. No. 12/904,047 of Atwater, H. et al. filed Oct. 13, 2010.
Final Office Action dated Feb. 8, 2016 for U.S. Appl. No. 13/772,043 of Archer, M.J. et al. filed Feb. 20, 2013.
Final Office Action dated Jan. 26, 2017, for Korean Patent Application No. KR-20127012346, 4 pages.
Final Office Action dated Jan. 29, 2016 for U.S. Appl. No. 13/446,876 of Kayes, B.M. et al. filed Apr. 13, 2012.
Final Office Action dated Mar. 4, 2016 for U.S. Appl. No. 14/696,106 of Kayes, Brendan M. filed Apr. 24, 2015.
Final Office Action dated Mar. 8, 2017 for U.S. Appl. No. 15/006,003 of Kayes, B.M. et al. filed Jan. 25, 2016.
Final Office Action dated Nov. 6, 2015 for U.S. Appl. No. 13/705,064 of Kayes, B.M. et al. filed Dec. 4, 2012.
Final Office Action dated Oct. 18, 2011, for U.S. Appl. No. 12/940,876 of Kizilyalli, I.C. et al. filed Nov. 10, 2010.
Final Office Action dated Oct. 28, 2016 for U.S. Appl. No. 14/846,675 of Kayes, B.M. et al. filed Sep. 4, 2015.
Final Office Action dated Sep. 11, 2017 for U.S. Appl. No. 12/904,047 of Atwater, H. et al. filed Oct. 13, 2010.
Final Office Action dated Sep. 16, 2011 for U.S. Appl. No. 12/940,861 of Kizilyalli, I.C. et al. filed Nov. 5, 2010.
Final Office Action dated Sep. 22, 2017 for U.S. Appl. No. 13/772,043 of Archer, M.J. et al. filed Feb. 20, 2013.
First Office Action dated Jun. 7, 2016 for Korean Patent Application No. KR-20127012346, 6 pages.
First Office Action dated Nov. 30, 2016 for Chinese Patent Application No. 201510475349.5, 21 pages.
**International Search Report and Written Opinion dated Jun. 1, 2010 for International Application No. PCT/US2009/061898 (ALTA/004PC).
**International Search Report and Written Opinion dated Jun. 1, 2010 for International Application No. PCT/US2009/061906 (ALTA/0005PCT).
**International Search Report and Written Opinion Dated Jun. 1, 2010 for International Application No. PCT/US2009/061911 (ALTA/0006PCT).
**International Search Report and Written Opinion dated Jun. 1, 2010 for International Application No. PCT/US2009/061914 (ALTA0007PCT).
**International Search Report and Written Opinion dated Jun. 1, 2010 for International Application No. PCT/US2009/061920 (ALTA/0008PCT).
International Search Report and Written Opinion dated Dec. 2, 2016 for International Patent Application No. PCT/US2016/052939, 12 pages.
International Search Report and Written Opinion dated May 23, 2016 for International Patent Application No. PCT/US2016/014866, 12 pages.
International Search Report and Written Opinion dated May 8, 2017 for International Patent Application No. PCT/US2017/015387, 10 pages.
Non-Final Office Action dated Apr. 25, 2015 for U.S. Appl. No. 13/705,064 of Kayes, B.M. et al. filed Dec. 4, 2012.
Non-Final Office Action dated Apr. 7, 2016 for U.S. Appl. No. 13/705,064 of Kayes, B.M. et al. filed Dec. 4, 2012.
Non-Final Office Action dated Apr. 7, 2016 for U.S. Appl. No. 14/846,675 of Kayes, B.M. et al. filed Sep. 4, 2015.
Non-Final Office Action dated Apr. 7, 2017 for U.S. Appl. No. 13/772,043 of Archer, M.J. et al. filed Feb. 20, 2013.
Non-Final Office Action dated Aug. 16, 2017 for U.S. Appl. No. 14/846,675 of Kayes, B.M. et al. filed Sep. 4, 2015.
Non-Final Office Action dated Aug. 19, 2011 for U.S. Appl. No. 12/605,108 of Kizilyalli, I.C. et al. filed Nov. 23, 2009.
Non-Final Office Action dated Jan. 16, 2014 for U.S. Appl. No. 12/904,047 of Atwater, H. et al. filed Oct. 13, 2010.
Non-Final Office Action dated Jan. 30, 2014 for U.S. Appl. No. 13/354,175 of Higashi, G. et al. filed Jan. 19, 2012.
Non-Final Office Action dated Jul. 16, 2015 for U.S. Appl. No. 13/446,876 of Kayes, B.M. et al. filed Apr. 13, 2012.
Non-Final Office Action dated Jul. 16, 2015 for U.S. Appl. No. 13/772,043 of Archer, M.J. et al. filed Feb. 20, 2013.
Non-Final Office Action dated Jul. 30, 2015 for U.S. Appl. No. 12/904,047 of Atwater, H. et al. filed Oct. 13, 2010.
Non-Final Office Action dated Jun. 28, 2016 for U.S. Appl. No. 13/446,876 of Kayes, B.M. et al. filed Apr. 13, 2012.
Non-Final Office Action dated Mar. 17, 2011, for U.S. Appl. No. 12/940,861 of Kizilyalli, I.C. et al. filed Nov. 5, 2010.
Non-Final Office Action dated Mar. 17, 2011, for U.S. Appl. No. 12/940,876 of Kizilyalli, I.C. et al. filed Nov. 10, 2010.
Non-Final Office Action dated May 31, 2016 for U.S. Appl. No. 12/904,047 of Atwater, H. et al. filed Oct. 13, 2010.
Non-Final Office Action dated Nov. 17, 2010 for U.S. Appl. No. 12/605,108 of Kizilyalli, I.C. et al. filed Nov. 23, 2009.
Non-Final Office Action dated Nov. 17, 2015 for U.S. Appl. No. 14/696,106 of Kayes, Brendan M. filed Apr. 24, 2015.
Non-Final Office Action dated Nov. 2, 2017 for U.S. Appl. No. 15/340,560 of Ding, I.-K. et al. filed Nov. 1, 2016.
Non-Final Office Action dated Sep. 22, 2016 for U.S. Appl. No. 15/006,003 of Kayes, B.M. et al. filed Jan. 25, 2016.
Non-Final Office Action dated Sep. 26, 2013 for U.S. Appl. No. 13/772,043 of Archer, M.J. et al. filed Feb. 20, 2013.
Notice of Allowance dated Aug. 12, 2014, for U.S. Appl. No. 12/940,876 of Kizilyalli, I.C. et al. filed Nov. 10, 2010.
Notice of Allowance dated Aug. 17, 2015 for U.S. Appl. No. 14/452,393 of Ding, I.-K. et al. filed Aug. 5, 2014.
Notice of Allowance dated Aug. 26, 2016 for U.S. Appl. No. 14/696,106 of Kayes, Brendan M. filed Apr. 24, 2015.
Notice of Allowance datedd Dec. 20, 2017 for U.S. Appl. No. 14/692,647 of Kayes, Brendan M. et al. filed Apr. 21, 2015.
Notice of Allowance dated Jan. 2, 2015 for U.S. Appl. No. 13/354,175 of Higashi, G. et al. filed Jan. 19, 2012.
Notice of Allowance dated Jul. 31, 2014 for U.S. Appl. No. 12/940,861 of Kizilyalli, I.C. et al. filed Nov. 5, 2010.
Notice of Allowance dated Jul. 25, 2016 for U.S. Appl. No. 14/452,393 of Ding, I.-K. et al. filed Aug. 5, 2014.
Notice of Allowance dated Jun. 19, 2014 for U.S. Appl. No. 12/605,108 of Kizilyalli, I.C. et al. filed Nov. 23, 2009.
Notice of Allowance dated Jun. 2, 2015 for U.S. Appl. No. 13/354,175 of Higashi, G. et al. filed Jan. 19, 2012.
Notice of Allowance dated Mar. 4, 2016 for U.S. Appl. No. 14/452,393 of Ding, I.-K. et al. filed Aug. 5, 2014.
Notice of Allowance dated May 5, 2017 for U.S. Appl. No. 13/705,064 of Kayes, B.M. et al. filed Dec. 4, 2012.
Notice of Allowance dated Oct. 20, 2016 for U.S. Appl. No. 12/904,047 of Atwater, H. et al. filed Oct. 13, 2010.
Notice of Allowance dated Feb. 27, 2015 for U.S. Appl. No. 13/451,455 of Nie, H. et al. filed Jul. 19, 2012.
Notice of Allowance dated Jan. 26, 2015 for U.S. Appl. No. 13/451,455 of Nie, H. et al. filed Jul. 19, 2012.
Notice of Allowance with Corrected Notice of Allowability dated Feb. 28, 2017 for U.S. Appl. No. 12/904,047 of Atwater, H. et al. filed Oct. 13, 2010.
Restriction Requirement dated Dec. 26, 2014 for U.S. Appl. No. 13/446,876 of Kayes, B.M. et al. filed Apr. 13, 2012.
Restriction Requirement dated Dec. 28, 2017 for U.S. Appl. No. 15/422,218 of Zhu, Y. et al. filed Feb. 1, 2017.
Restriction Requirement dated Jan. 22, 2013 for U.S. Appl. No. 12/904,047 of Atwater, H. et al. filed Oct. 13, 2010.
Restriction Requirement dated Jun. 22, 2016 for U.S. Appl. No. 15/006,003 of Kayes, B.M. et al. filed Jan. 25, 2016.
Restriction Requirement dated Nov. 18, 2016, for U.S. Appl. No. 14/692,647 of Kayes, Brendan M. et al. filed Apr. 21, 2015.

(56) References Cited

OTHER PUBLICATIONS

Restriction Requirement dated Oct. 24, 2014 for U.S. Appl. No. 13/705,064 of Kayes, B.M. et al. filed Dec. 4, 2012.
Supplementary Search Report dated Sep. 18, 2017 for Chinese Patent Application No. 201510475349.5, 1 page.
U.S. Appl. No. 15/837,533 of Kayes, B.M. et al. filed Dec. 11, 2017.
First Office Action dated Jun. 5, 2014, for Chinese Patent Application No. 201080046469 filed Oct. 14, 2010, 23 pages., Jun. 5, 2014.
Search Report dated Jun. 5, 2014, for Chinese Patent Application No. 201080046469 filed Oct. 14, 2010, 2 pages., Jun. 5, 2014.
Heckelmann, Stefan et al., "Investigations on AlxGa1—xAs Solar Cells Grown by MOVPE", IEEE Journal of Photovoltaics, IEEE, US, vol. 5, No. 1, Dec. 18, 2014, pp. 446-453.
Honer, A. et al., "Novel cost-effective bifacial silicon solar cells with 19.4% front and 18.1% rear efficiency", Applied physics letters 70(8), 1997, pp. 1008-1010.
Kang, et al., "Ultra-thin Film Nano-structured Gallium Arsenide Solar Cells", Proc. of SPJE, vol. 9277, No. 927718, pp. 1-7.
Lenkeit, B. et al., "Excellent thermal stability of remote plasma-enhanced chemical vapour deposited silicon nitride films for the rear of screen-printed bifacial silicon solar cells", Solar energy materials and solar cells 65(1), 2001, pp. 317-323.
Mathews, Ian et al., "GaAs solar cells for Indoor Light Harvesting", 2014 IEEE 40th Photovoltaic Specialist Conference (PVSC), IEEE, Jun. 8, 2014, pp. 510-513.
McClelland, R.W. et al., "High-Efficiency Thin-Film GaAs Bifacial Solar Cells", Proceedings of IEEE Photovoltaic Specialists Conference, 1990,, May 21, 1990-May 25, 1990, pp. 145-147.
McPheeters, et al., "Computational analysis of thin film JnGaAs/GaAs quantum well solar cells with backside light trapping structures", Optics Express, Vcol. 20, No. S6, Nov. 5, 2012, pp. A864-A878.
Mellor, et al., "A numerical study of Bi-periodic binary diffraction gratings for solar cell applications", Solar Energy Materials & Solar Cells 95, 2011, pp. 3527-3535.
Ohtsuka, H. et al., "Effect of light degradation on bifacial Si solar cells", Solar energy materials and solar cells 66(1), 2001, pp. 51-59.
Van Geelen, A. et al., "Epitaxial lift-off GaAs solar cell from a reusable GaAs substrate", Materials Science and Engineering: B, vol. 45, No. 1-3, Mar. 1997, pp. 162-171.
Yang, et al., "Ultra-Thin GaAs Single-Junction Solar Cells Integrated with an AlInP Layer for Reflective Back Scattering", (4 total pages).
Yazawa, Y. et al., "GaInP single-junction and GaInP/GaAs two-junction thin-film solar cell structures by epitaxial lift-off", Solar Energy Materials and Solar Cells, vol. 50, No. 1-4, 1998, pp. 229-235.
European Search Report corresponding to European Application No. 19185026, dated Jan. 1, 2020.
Sutherland, Joseph, et al., "A Computer Analysis of Heterojunction and Graded Composition Solar Cells", IEEE Transactions on Electron Devices, vol. 24, No. 4, Apr. 1977, pp. 363-372.
Brown, G.F., et al., "Finite element simulations of compositionally graded InGaN solar cells", Elsevier, Solar Energy Materials & Solar Cells, vol. 94, No. 3, Mar. 2010, pp. 478-483.
Sutherland, Joseph, et al., "Optimum Bandgap of Several III-V Heterojunction Solar Cells", Solid-State Electronics, vol. 22, No. 1, 1979, pp. 3-5.

* cited by examiner

800

Epitaxially grow a device on a substrate, the device having a first side and a second side closer to the substrate, the device being configured to receive light at the second side of the device 810

- Grow a plurality of stacked p-n layers between the first side and the second side of the device 815
  - Grow a window layer 820
  - Deposit a reflector layer 825
    - Deposit a textured layer between the plurality of stacked p-n layers and the reflector 830
      - Deposit an ARC over the textured layer 835
    - Form a plurality of non-continuous contacts 840

- Epitaxially grow the device over a sacrificial layer deposited over the substrate 850

Remove the device from the substrate using a lift off process 860

- Separate the device from the substrate by removing a sacrificial layer 870

*FIG. 8*

MULTI-JUNCTION OPTOELECTRONIC DEVICE

CROSS-REFERENCE TO RELATED APPLICATION

The present application is a Continuation-in-Part of, and claims priority to, U.S. application Ser. No. 13/705,064 filed on Dec. 4, 2012, which is a Continuation-in-Part of, and claims priority to, U.S. application Ser. No. 12/939,077 filed on Nov. 3, 2010 and is also a Continuation-in-Part of, and claims priority to, U.S. application Ser. No. 12/605,108 filed on Oct. 23, 2009. Each of these applications is hereby incorporated by reference in its entirety.

BACKGROUND OF THE DISCLOSURE

The present disclosure generally relates to optoelectronic semiconductor devices, and more particularly to multi junction optoelectronic devices.

There is a need for providing optoelectronic devices that have increased efficiency when compared to conventional devices. These devices should, however, be cost effective, easily implemented and adaptable to existing environments. The present disclosure addresses such a need.

SUMMARY OF THE DISCLOSURE

An optoelectronic semiconductor device is disclosed. The optoelectronic device comprises a plurality of stacked p-n junctions, each of the plurality of stacked p-n junctions comprising a p-doped layer. The optoelectronic semiconductor device further includes a n-doped layer disposed below the p-doped layer to form a p-n layer such that electric energy is created when photons are absorbed by the p-n layer, wherein recesses are formed on top of the p-doped layer at the top of the plurality of stacked p-n junctions; wherein the junctions create an offset and an interface layer is formed on top of the p-doped layer at the top of the plurality stacked p-n junctions. The optoelectronic semiconductor device also includes a window layer disposed below the plurality stacked p-n junctions.

In another aspect, one or more optical filters are inserted into a multi junction photovoltaic device to enhance its efficiency through photon recycling. The optical filter is specific to the angle and wavelength of the light so that it reflects reemitted photons for recycling while it transmits the incident light for absorption by lower junctions.

In another aspect, a method for fabricating a device (e.g., an optoelectronic semiconductor device) is described that includes epitaxially growing the device on a substrate, the device having a first side and a second side closer to the substrate, the device being configured to receive light at the second side of the device. The epitaxially growing of the device includes epitaxially growing a plurality or multiple of stacked p-n layers between the first side and the second side of the device, each of the plurality of stacked p-n layers comprising a p-doped layer and an n-doped layer, with a p-n junction formed between the p-doped layer and the n-doped layer such that at least one of the plurality of stacked p-n layers generates electrical energy when photons are absorbed by that p-n layer in response to the device being exposed to a light source on the second side of the device, and each p-n layer having a first side and a second side, and the first side of each p-n layer being closer than its second side to the first side of the device. The method may further include removing the device from the substrate using a lift off process (e.g., using an epitaxial lift off (ELO) process).

BRIEF DESCRIPTION OF THE DRAWINGS

So that the manner in which the above recited features of the disclosure can be understood in detail, a more particular description of the disclosure, briefly summarized above, may be had by reference to the embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 8 is a flowchart that illustrates an example of a method for making a multi-junction optoelectronic device using a lift off process.

DETAILED DESCRIPTION

The present disclosure generally relates to optoelectronic semiconductor devices, and more particularly to multi junction optoelectronic devices. The following description is presented to enable one of ordinary skill in the art to make and use the disclosure and is provided in the context of a patent application and its requirements. Various modifications to the preferred embodiment and the generic principles and features described herein will be readily apparent to those skilled in the art. Thus, the present disclosure is not intended to be limited to the embodiment shown but is to be accorded the widest scope consistent with the principles and features described herein.

As used herein, the terms epitaxial growth, growth, and deposition can all refer to techniques by which one or more epitaxial films or epitaxial layers of material can be formed. Accordingly, these terms may be used interchangeably in connection with some aspects of the disclosure.

Figure 1:
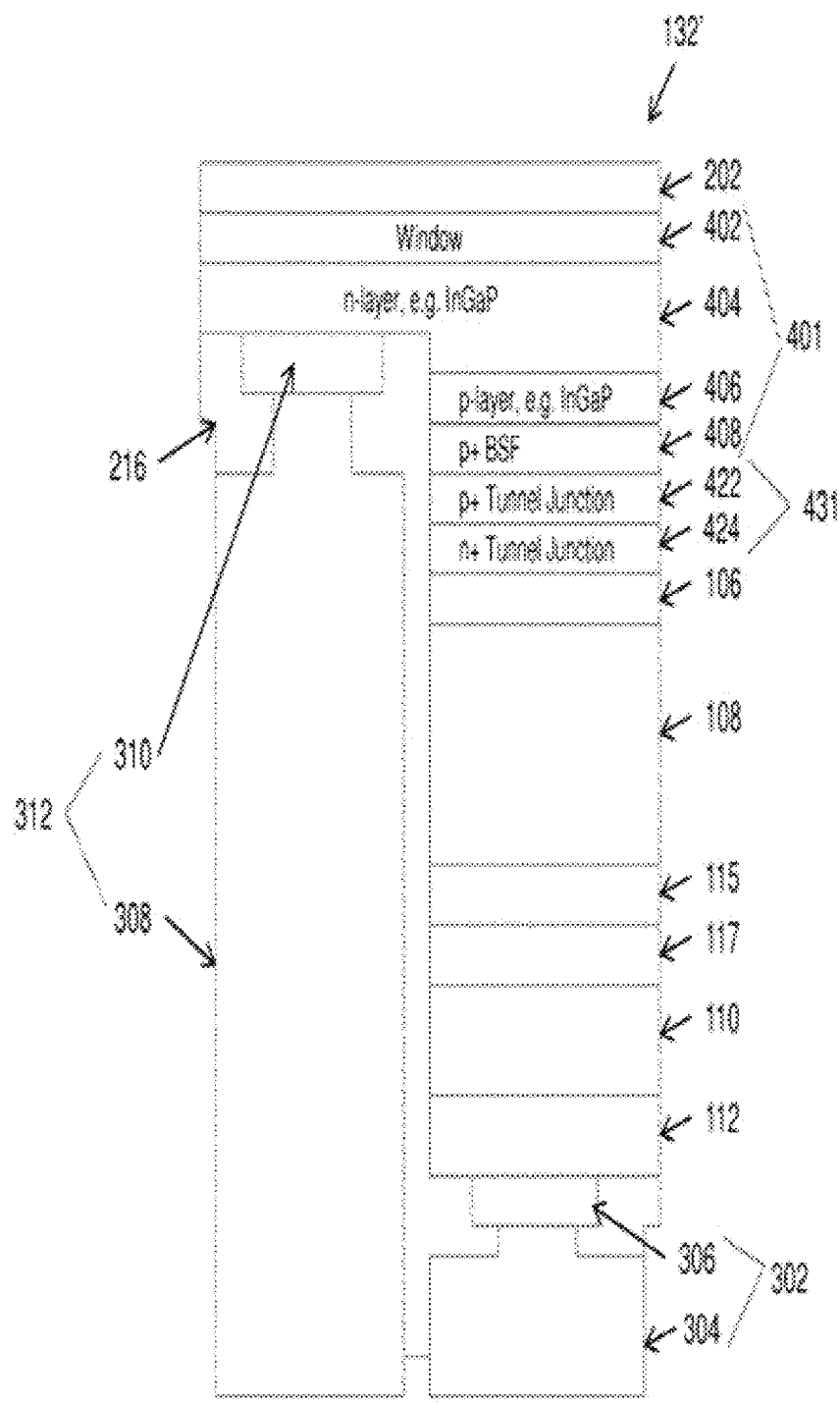
FIG. 1 is a diagram which depicts a first embodiment of a multi junction optoelectronic device.

FIG. 1 depicts a multi junction optoelectronic device 100 in accordance with an embodiment. 100 is a single-sided photovoltaic device and therefore contains both contacts, such as the p-metal contact 302 and the n-metal contact 312, disposed on the same side of optoelectronic device 100, as described by other embodiments herein. An anti-reflective coating (ARC) layer 202 may be disposed over a window layer 402. The ARC layer 202 contains a material that allows light to pass through while preventing light reflection from the surface of the ARC layer 202.

A p-n junction structure 401 of higher bandgap has been added above a structure 431 between the ARC layer 202 and the front window layer 106. Structure 401 is comprised of a window layer 402 (for example AlInP, AlGaInP, or AlGaAs), an n-type material 404 (for example InGaP or AlGaAs), a p-type material 406 (for example, InGaP or AlGaAs), and back-surface field or back side window layer 408 (for example, AlInP, AlGaInP, or AlGaAs). This structure is electrically and optically connected to structure 431 through a tunnel junction structure 431. Structure 431 is comprised of a highly p-type doped layer 422 (for example, InGaP or AlGaAs), and a highly n-type doped layer 424 (for example, InGaP or AlGaAs). One of ordinary skill in the art readily recognizes a variety of materials listed could differ from the examples listed herein. Furthermore, the p-n junction formed in structure 401 could be a homojunction or a heterojunction; that is, both the n-type doped layer 404 and p-type doped layer 406 could be the same material, or could be different materials, and that would be within the spirit and scope of the present disclosure. Also the doping could be inverted, with p-type material at the top of the device, facing the sun, and n-type material at the bottom. One or more additional p-n structures could be added to structure 401 in a similar fashion, either above or below structure 401, and possibly coupled to the rest of the device through a tunnel junction layer or layers.

For some embodiments, the n-type front window 106, the p-type emitter layer 110, and/or the p-type contact layer 112 may be roughened or textured. Each of the n-type front window 106, the p-type emitter layer 110, and/or the p-type contact layer 112 may be roughened for example by an etching process, such as a wet etching process or a dry etching process. This roughening may also be achieved by other processes, such as by using lattice mismatched materials during epi growth to induce strain. Texturing may be achieved for example by applying small particles, such as polystyrene spheres, to the surface of the n-type front window 106 before applying the ARC layer 202. By roughening or texturing the n-type front window 106, the p-type emitter layer 110, and/or the p-type contact layer 112, different angles are provided at the interface between the ARC layer 202 and the n-type front window 106, which may have different indices of refraction. In this manner, more of the incident photons may be transmitted into the n-type front window 106 rather than be reflected from the interface between the ARC layer 202 and the n-type front window 106, because some angles of incidence for photons are too high according to Snell's Law. Thus, roughening or texturing the n-type front window 106, the p-type emitter layer 110, and/or the p-type contact layer 112 may provide increased trapping of light.

As shown in FIG. 1, both the p-metal contact 302 and the n-metal contact 312 are on the back side of the optoelectronic device 100 while the ARC layer 202 is on the sun side or front side of the optoelectronic device 100 that receives light 132. The p-metal contact 302 contains a p-metal contact layer 304 disposed on a p-metal contact layer 306, while the n-metal contact 312 contains an n-metal contact layer 308 disposed on an n-metal alloy contact 310, in some embodiments described herein.

In some embodiments, the optoelectronic device 100 may be formed from a gallium arsenide based cell. In one example, a resist mask may be formed on the exposed surface of the p-type contact layer 112 and pattern recesses and holes may be formed during a photolithography process. The pattern recesses and holes extend through the p-type contact layer 112, the p-type emitter layer 110, the n-type back window 117, and the graded layer 115, and partially into the n-type absorber layer 108. Thereafter, the resist mask is removed to reveal the n-type absorber layer 108 and the p-type contact layer 112 as the exposed surfaces on the back side of the optoelectronic device 100, as viewed from the two-dimensional perspective towards the back side of the optoelectronic device 100. The sidewalls of the recesses and holes reveal exposed surfaces of the p-type contact layer 112, the p-type emitter layer 110, the n-type back window 117, and the graded layer 115, and partially into the n-type absorber layer 108.

In one embodiment, the p-metal contact layer 306 is formed on a portion of the exposed the p-type contact layer 112, and the n-metal alloy contact 310 is formed on a portion of the exposed the n-type absorber layer 108. Thereafter, the insulation layer 216 may be deposited over the surface of the optoelectronic device 100, such as to cover all exposed surfaces including the p-metal contact layer 306 and the n-metal alloy contact 310. Subsequently, the exposed surfaces of the p-metal contact layer 306 and the n-metal alloy contact 310 are revealed by etching pattern holes into the insulation layer 216 by a lithography process. In some embodiments, the p-metal contact layer 306 and the n-metal alloy contact 310 are formed prior to separating the gallium arsenide based cell from a growth wafer during an epitaxial lift off (ELO) process while the insulation layer 216 is formed subsequent to the ELO process. The p-metal contact layer 304 may be formed on the p-metal contact layer 306 and a portion of the insulation layer 216, while the n-metal contact layer 308 may be formed on the n-metal alloy contact 310 and other portions of the insulation layer 216 to form the optoelectronic device 100, as depicted in FIG. 1. In some examples, the p-metal contact layer 304 and the n-metal contact layer 308 may be formed containing the same compositional layers of material as each other and in other examples, the p-metal contact layer 304 and the n-metal contact layer 308 are simultaneously formed on the optoelectronic device 100 during the same metallization steps.

In an alternative embodiment, the p-metal contact 302 and the n-metal contact 312 may be fabricated, in whole or in part, and subsequently, the insulation layer 216 may be formed over and on the sidewalls of the recesses between and around the p-metal contact 302 and the n-metal contact 312. In another alternative embodiment, the insulation layer 216, in whole or in part, may be formed on the optoelectronic device 100 prior to forming the p-metal contact 302 and the n-metal contact 312.

Despite all the contacts, such as the p-metal contact 302 and the n-metal contact 312, being on the back side of the optoelectronic device 100 to reduce solar shadows, dark current and its stability with time and temperature may still be concerns when designing an efficient photovoltaic device, such as the optoelectronic device 100. Therefore, for some embodiments, an insulation layer 216 may be deposited or otherwise formed on the back side of the optoelectronic device 100. The insulation layer 216 contains an electrically insulating material or grout which helps to reduce the dark current within the optoelectronic device 100.

The insulation layer 216 may contain an electrically insulating material or grout, such as silicon oxides, silicon dioxide, silicon oxynitride, silicon nitride, polysiloxane or silicone, sol-gel materials, titanium oxide, tantalum oxide, zinc sulfide, derivatives thereof, or combinations thereof. The insulation layer 216 may be formed by a passivation method, such as by a sputtering process, an evaporation process, a spin-coating process, or a CVD process.

In another embodiment, the insulation layer 216 eliminates or substantially reduces electrical shorts from occurring between the p-metal contact 302 and the n-metal contact 312. The insulation layer 216 contains an electrically insulating grout and/or other electrically insulating material that has an electrical resistance of at least 0.5 MΩ (million ohms) or greater, such as within a range from about 1 MΩ to about 5 MΩ, or greater. Exemplary grouts or other electrically insulating materials may contain a polymeric material, such as ethylene vinyl acetate (EVA), polyimide, polyurethane, epoxy, derivatives thereof, or combinations thereof. In one example, the electrically insulating grout contains a photosensitive polyimide coating. In another example, the electrically insulating grout contains a thermal set of polymeric material.

In many embodiments, the n-metal alloy contact 310 may be formed by a low temperature process, which includes low temperature deposition processes followed by a low temperature, thermal anneal process. Suitable contact materials deposited within the n-metal alloy contact 310 by low temperature deposition processes may include palladium, germanium, palladium germanium alloy, titanium, gold, nickel, silver, copper, platinum, alloys thereof, or combinations thereof, among others.

In another embodiment, the n-metal alloy contact 310 may contain multiple layers of conductive materials including a palladium germanium alloy. The n-metal alloy contact 310 is disposed between the n-type absorber layer 108 and the n-metal contact layer 308 for providing a strong ohmic contact therebetween. The palladium germanium alloy within the n-metal alloy contact 310 allows a high conductivity of the electric potential from the gallium arsenide materials within the n-type absorber layer 108, across n-metal alloy contact 310, and to the n-metal contact layer 308. The n-metal alloy contact 310 can also contain a metallic capping layer which can be provided, for example, on the palladium germanium alloy layer. In some embodiments, the capping layer can include an adhesion layer and a high conductivity layer. For example, the adhesion layer can allow the conductivity layer to adhere to the alloy layer. In some examples, the adhesion layer may contain titanium, tin, zinc, alloys thereof, or combinations thereof and the high conductivity layer may contain gold, silver, nickel, copper, aluminum, alloys thereof, or combinations thereof, or a stack of multiple different metal layers and/or alloy layers. In one example, the n-metal alloy contact 310 contains a high conductivity layer containing gold disposed on an adhesion layer containing titanium, which is disposed on a palladium germanium alloy.

Similar fabrication methods and embodiments as described above are also fabricated for the p-metal contact layer 304 and/or the n-metal contact layer 308 on the optoelectronic device 100. Some of the example embodiments include n-metal alloy contact 304, p-metal contact 302, n-metal contact 312, n-metal alloy contact 310, and other layers suitable for use with contact layers of the cell 300 are described in U.S. patent application Ser. No. 12/939,050, entitled, "Metallic Contacts for Photovoltaic Devices and Low-Temperature Fabrication Processes Thereof," filed on Nov. 3, 2010, and which is incorporated herein by reference. Other types, structures, and materials of metal contact layers can also be used with the optoelectronic device 100.

The contact layers can contain Group III-V materials, such as gallium arsenide (GaAs), depending on the desired composition of the final photovoltaic unit. According to embodiments described herein, the contact layers may be heavily n-doped. In some embodiments, the doping concentration may be within a range greater than about $5 \times 10^{18}$ cm$^{-3}$, for example, from greater than about $5 \times 10^{18}$ cm$^{-3}$ to about $1 \times 10^{19}$ cm$^{-3}$. The high doping of the contact layers of the cell 300 allows an ohmic contact to be formed with a later-deposited metal layer without any annealing step performed to form such an ohmic contact, as described below.

In some embodiments, the contact layers may be gallium arsenide (GaAs) doped with silicon (Si). For example, some embodiments using a high-growth rate in forming the layers of the structure can use a silicon dopant (as an n-dopant) to bring the doping concentration to $5 \times 10^{18}$ cm$^{-3}$ or greater. For example, a precursor disilane can be introduced in a fast growth rate process to deposit the silicon. In other embodiments selenium (Se) or tellurium (Te) can be used as a dopant in the formation of the layers of structure.

The contact layers may be formed at a thickness of about 10 nm or greater, such as about 50 nm. In some embodiments, the contact layer 20 can be formed prior to an ELO process that separates the structure from the growth wafer. In some alternate embodiments, the contact layers can be formed at a later stage subsequent to such an ELO process.

In the embodiment of FIG. 1, the current generated by the top cell must be equal to the current generated by the bottom cell. This is because of the electrical connection therebetween. Hence, although the optoelectronic device 100 operates effectively it is desirable sometimes to remove this requirement.

Figure 2:
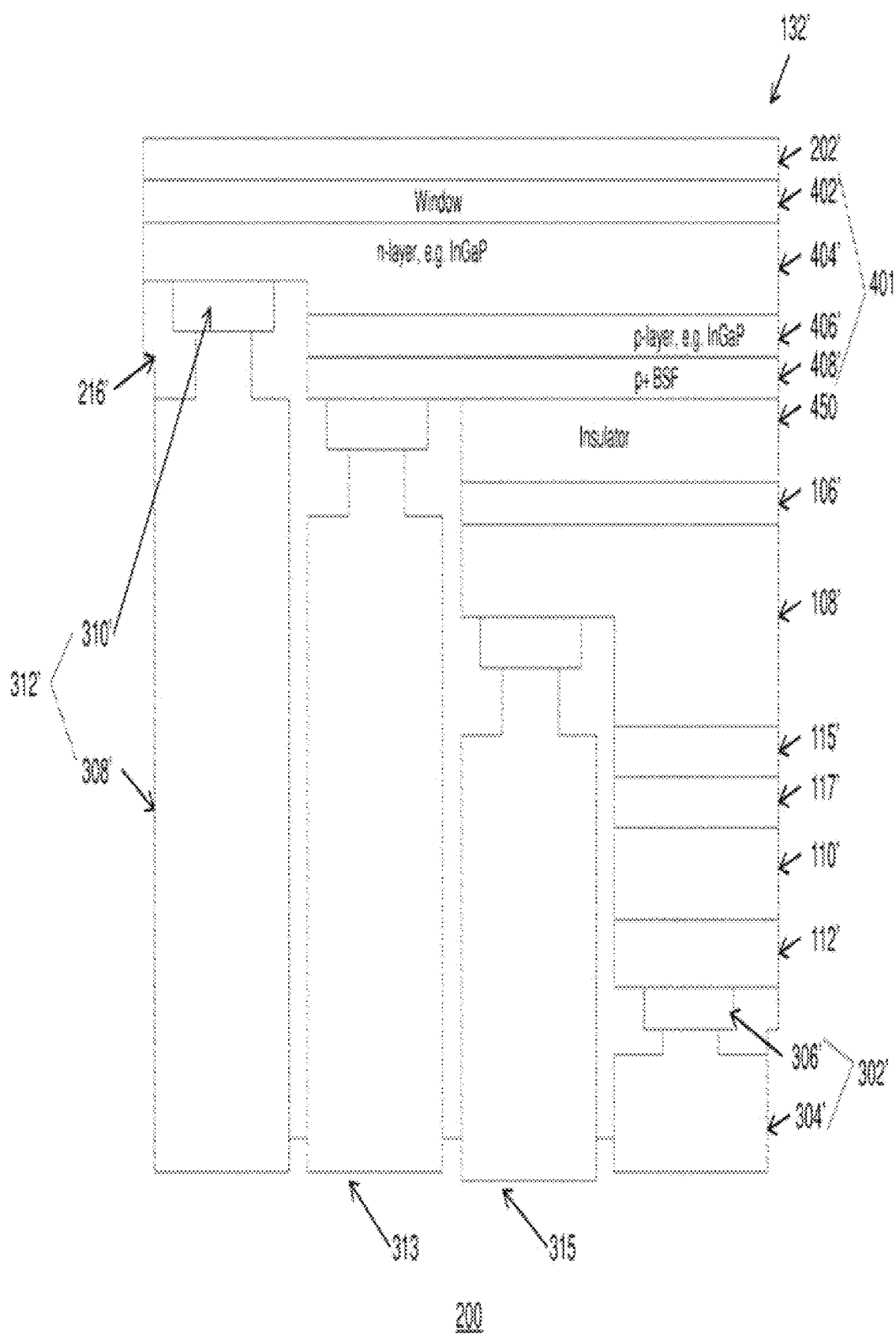
FIG. 2 is a diagram which depicts a second embodiment of a multi junction optoelectronic device.

FIG. 2 is a diagram which depicts a second embodiment of a multi junction optoelectronic device 200. In this embodiment, which has similar elements to those in FIG. 1, there are two additional contacts 313 and 315. Contact 313 is electrically coupled to contact 312' and contact 315 is coupled to contact 302'. In this embodiment, the current flow is between contacts 312' and contact 313 for the first cell and between contacts 315 and 302' for the second cell. In this embodiment, the current flows can be independent from each other by placing an insulator 450 therebetween. Therefore the cells can operate with independent currents dependent upon the application of the device.

Figure 3:
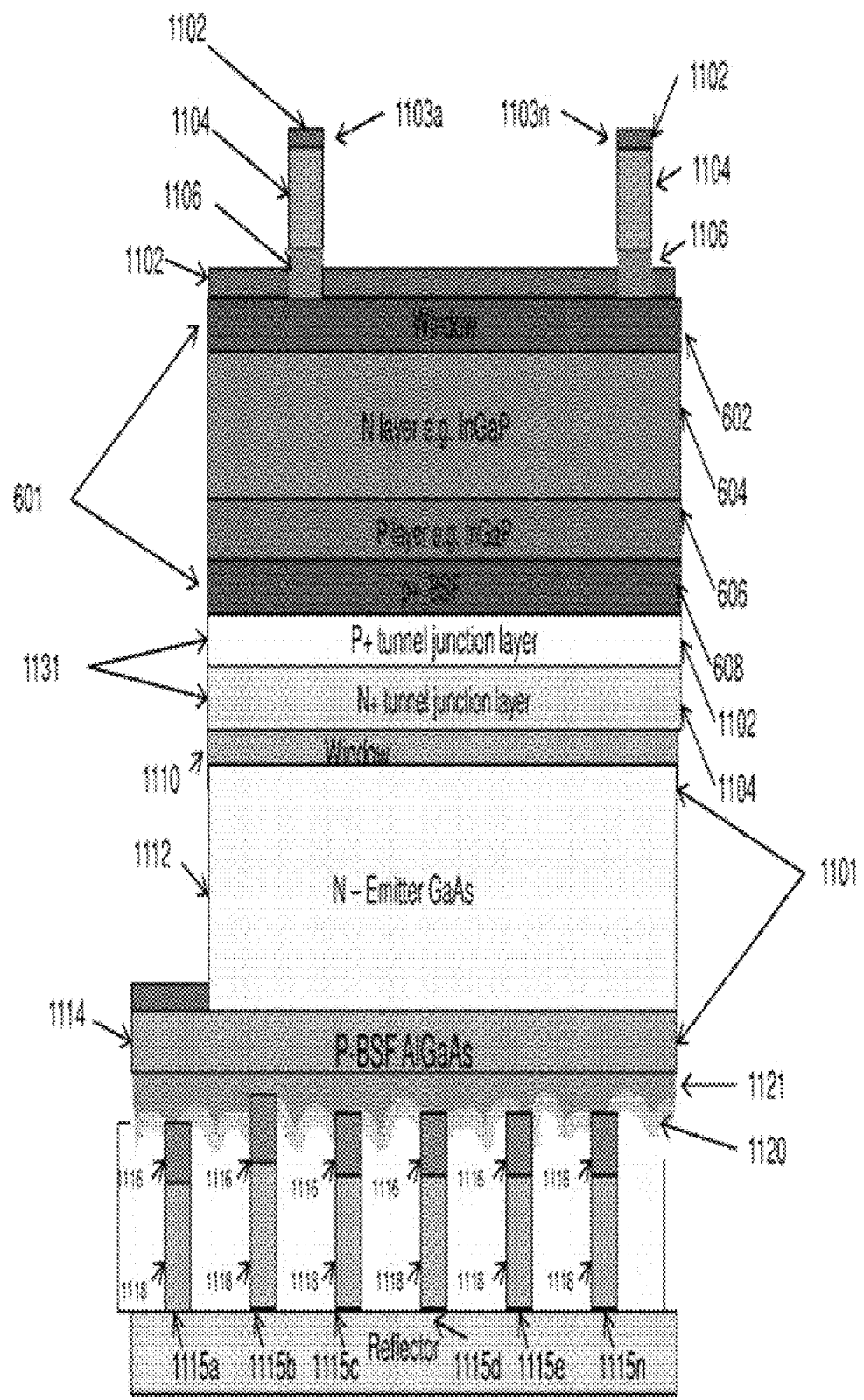
FIG. 3 is a diagram which depicts a third embodiment of a multi junction optoelectronic device.

FIG. 3 is a diagram which depicts a third embodiment of a multi junction optoelectronic device. The device 600 includes a semiconductor structure 1101. In an embodiment, the semiconductor structure 1101 comprises an n-layer 1112 and p-layer 1114 coupled together. For example, the n-layer is an n-emitter GaAs layer 1112 and the p-layer is a p-BSF (Back Surface Field) AlGaAs layer 1114. However, one of ordinary skill in the art readily recognizes a variety of materials including but not limited to GaAs, AlGaAs, InGaP, InGaAs, and alloys thereof, etc., could be utilized for either of these layers and that would be within the spirit and scope of the present disclosure. Furthermore, the junction formed between the two layers does not have to be a heterojunction, that is, both the n-layer 1112 and p-layer 1114 could be the same material (both layers being GaAs or both layers AlGaAs, for example) and that would be within the spirit and scope of the present disclosure. Also the doping could be inverted, with p-type material at the top of the device, facing the sun, and n-type material at the bottom. Furthermore, the optoelectronic device could be comprised of multiple p-n layers grown in series, for example, to form a multi junction solar cell.

In another embodiment, a solar cell includes an absorber layer made of gallium arsenide (GaAs) and having only one type of doping, and an emitter layer made of a different material than the absorber layer and having a higher bandgap than the absorber layer. An intermediate layer is provided between the absorber layer and the emitter layer, the intermediate layer having the same type of doping as the absorber layer, wherein the intermediate layer includes a material gradation from GaAs at a side closer to the absorber layer, to the different material of the emitter layer at a side closer to the emitter layer. A heterojunction is formed between the emitter layer and the absorber layer, and a p-n junction is formed between the emitter layer and the absorber layer and at least partially within the different material at a location offset from the heterojunction. The p-n junction causes a voltage to be generated in the cell in response to the device being exposed to light at a front side of the solar cell.

Figure 4:
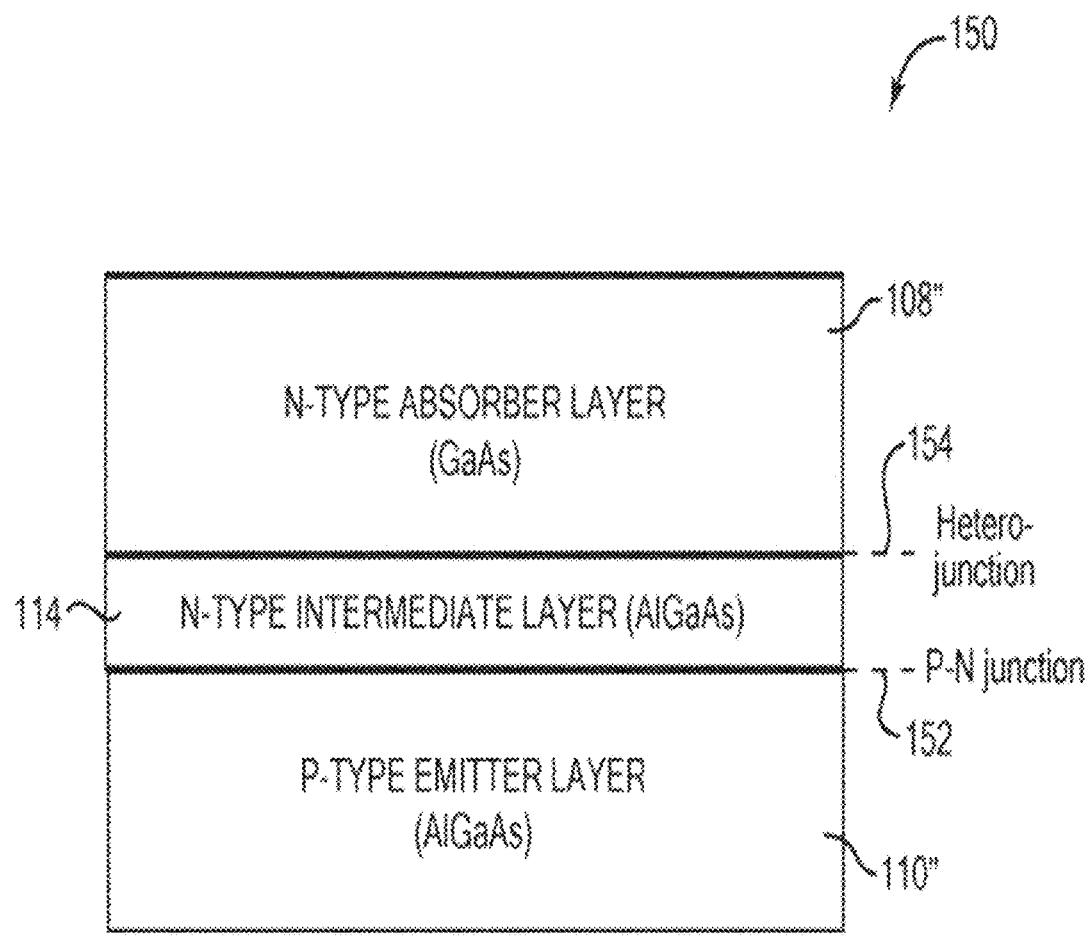
FIG. 4 is a diagram which depicts a fourth embodiment of a multi junction optoelectronic device.

In other embodiments, as shown in FIG. 4, an intermediate layer 114 may be formed between the n-type absorber layer 108" and the p-type emitter layer 110". The intermediate layer 114 can provide a material transition between the n-type absorber layer 108 and the p-type emitter layer 110".

FIG. 4 shows a portion of one embodiment 150 of cell 140 including absorber layer 108", an intermediate layer 114, and emitter layer 110". In some embodiments, the intermediate layer 114 contains the same or substantially the same material as the emitter layer 110", e.g., such as aluminum gallium arsenide in embodiments in which the emitter layer 110" contains aluminum gallium arsenide. In addition, the intermediate layer 114 has the same type of doping as the absorber layer 108". For example, the intermediate layer may have the formula of molar ratios of $Al_xGa_{1-x}As$ for example a molar ratio of $Al_{0.3}Ga_{0.7}As$ and be n-doped within a range from about $1\times10^{16}$ atoms/cm$^3$ to about $1\times10^{19}$ atoms/cm$^3$, for example $1\times10^7$ atoms/cm$^3$. The dopant concentrations can be the same or substantially the same as the n-type absorber layer 108". In some embodiments the intermediate layer 114 can have a thickness of about two depletion lengths, where a depletion length is the width of the depletion region formed around the p-n junction. For example, in some embodiments the intermediate layer 114 can have a thickness in the range of about 0 to 200 nm.

This embodiment of the cell 140 provides a structure that allows the p-n junction that generates voltage for the cell to be offset from the heterojunction provided by materials having different bandgaps. For example, the p-n junction 152 is at the interface between the n-type and p-type materials of the emitter layer 110" and the intermediate layer 114. Thus, in one described embodiment, the p-n junction is provided at least partially within the higher-bandgap material of which the emitter layer 110" and intermediate layer 114 are composed (e.g., AlGaAs), and the heterojunction 122 is located at the interface between the intermediate layer 114 and the absorber layer 108" (e.g., the interface between GaAs and AlGaAs). This offset provides some advantages over a coincident p-n junction and heterojunction. For example, the offset p-n junction provided between the AlGaAs layers can reduce barrier effects of an interface between the AlGaAs and GaAs layers. In some embodiments, a majority of the absorber layer 108 is outside of a depletion region formed by the p-n junction.

In some embodiments, the heterojunction 154 is located within two depletion lengths of the p-n junction 152. For example, a depletion region may be about 1000 Å (100 nm) wide in some embodiments. The depletion region typically still has a depletion effect past this region, within about two depletion region widths (depletion lengths) of the p-n junction. A heterojunction located further than this distance from the p-n junction may not allow the depletion effect to span the heterojunction interface and a barrier may thus exist.

In this embodiment, on a top side of the semiconductor structure 1101 are a plurality of contact members 1103a-1103n. Each of the top-side contact members 1103a-1103n comprise an optional antireflective coating (ARC) 1102, a n-metal contact 1104 underneath the optional ARC 1102, and a gallium arsenic (GaAs) contact 1106 underneath the n-metal contact. On a back side of the semiconductor structure 1101 is a plurality of non-continuous contacts 1115a-1115n. Each of the non-continuous contacts 1115 includes an optional contact layer 1116 coupled to the back side of the semiconductor structure 1101 and a p-metal contact 1118 underneath contact layer 1116. An optional ARC layer 1120 may also be present on the back side of the device. These may also be a textured layer 1121, between the ARC 1120 and the p-layer 1114.

Similar to FIG. 1, the contact layers can contain Group III-V materials, such as gallium arsenide (GaAs), depending on the desired composition of the final photovoltaic unit. According to embodiments described herein, the contact layers may be heavily n-doped. In some embodiments, the doping concentration may be within a range greater than about $5\times10^{18}$ cm$^{-3}$, for example, from greater than about $5\times10^{18}$ cm$^{-3}$ to about $1\times10^{13}$ cm$^{-3}$. The high doping of the contact layers of the cell 300 allows an ohmic contact to be formed with a later-deposited metal layer without any annealing step performed to form such an ohmic contact.

An additional p-n junction structure 601 of higher bandgap is included in this device. Structure 601 is comprised of a window layer 602 (for example, AlInP, AlGaInP, or AlGaAs), an n-type material 604 (for example, InGaP or AlGaAs), a p-type material 606 (for example, InGaP or AlGaAs), and back-surface field or back side window layer 608 (for example, AlInP, AlGaInP, or AlGaAs). This structure is electrically and optically connected to structure 1101 through a tunnel junction structure 1131. Structure 1131 is comprised of a highly p-type doped layer 1102 (for example, InGaP or AlGaAs), and a highly n-type doped layer 1104 (for example, InGaP or AlGaAs).

One of ordinary skill in the art readily recognizes that a variety of materials listed could differ from the examples listed herein. Furthermore, the p-n junction formed in structure 601 could be a homojunction or a heterojunction, that is, both the n-layer 604 and p-layer 606 could be the same material, or could be different materials, and that would be within the spirit and scope of the present disclosure. Also the doping could be inverted, with p-type material at the top of the device, facing the sun, and n-type material at the bottom. One or more additional p-n structures could be added to structure 1101 in a similar fashion, either above or below structure 1101, and could be possibly coupled to the rest of the device through a tunnel junction layer or layers.

U.S. application Ser. No. 13/223,187, entitled "Photon Recycling in an Optoelectronic Device", which is incorporated herein in its entirety by reference, describes in detail the advantages of the properties that make for effective photon recycling in a single junction optoelectronic device. Accordingly, in an embodiment, the process of photon recycling within the multi junction optoelectronic device is utilized to enhance its operation.

Photon recycling is the process by which a photon is absorbed, or generated within the semiconductor layers of an optoelectronic device, such as a photovoltaic device, so that the device can generate an electron-hole pair which then radiatively recombines to create another photon. This photon can then create another electron-hole pair, and so on. Under open-circuit conditions, this process can repeat itself many times—this is photon recycling. For an optoelectronic device this can create a much higher probability that photo-generated carriers are collected, increasing the effective lifetime of the device. Similarly, for a device such as an LED, this can greatly increase the probability that generated photons will escape the semiconductor.

Photon recycling requires a device with very low carrier losses to non-radiative recombination processes in the semiconductor, and very low photon losses due to processes that do not allow the photons to escape out through the front of the device. As such, it is associated with highly-efficient devices in general, particularly devices that have very low dark-current. For an optoelectronic device under open-circuit conditions, the carrier density within the device can be greatly increased due to the recycling as described above, which in turn will lead to a greatly increased $V_{OC}$. Indeed, in terms of an electrical output, a high $V_{OC}$ is the primary signature of photon recycling. Photon recycling can also boost other performance metrics of the device, such as the maximum-power operating voltage $V_{max}$, the associated current density $J_{max}$, the short-circuit current density $J_{SC}$, as well as the overall device efficiency.

Figure 5:
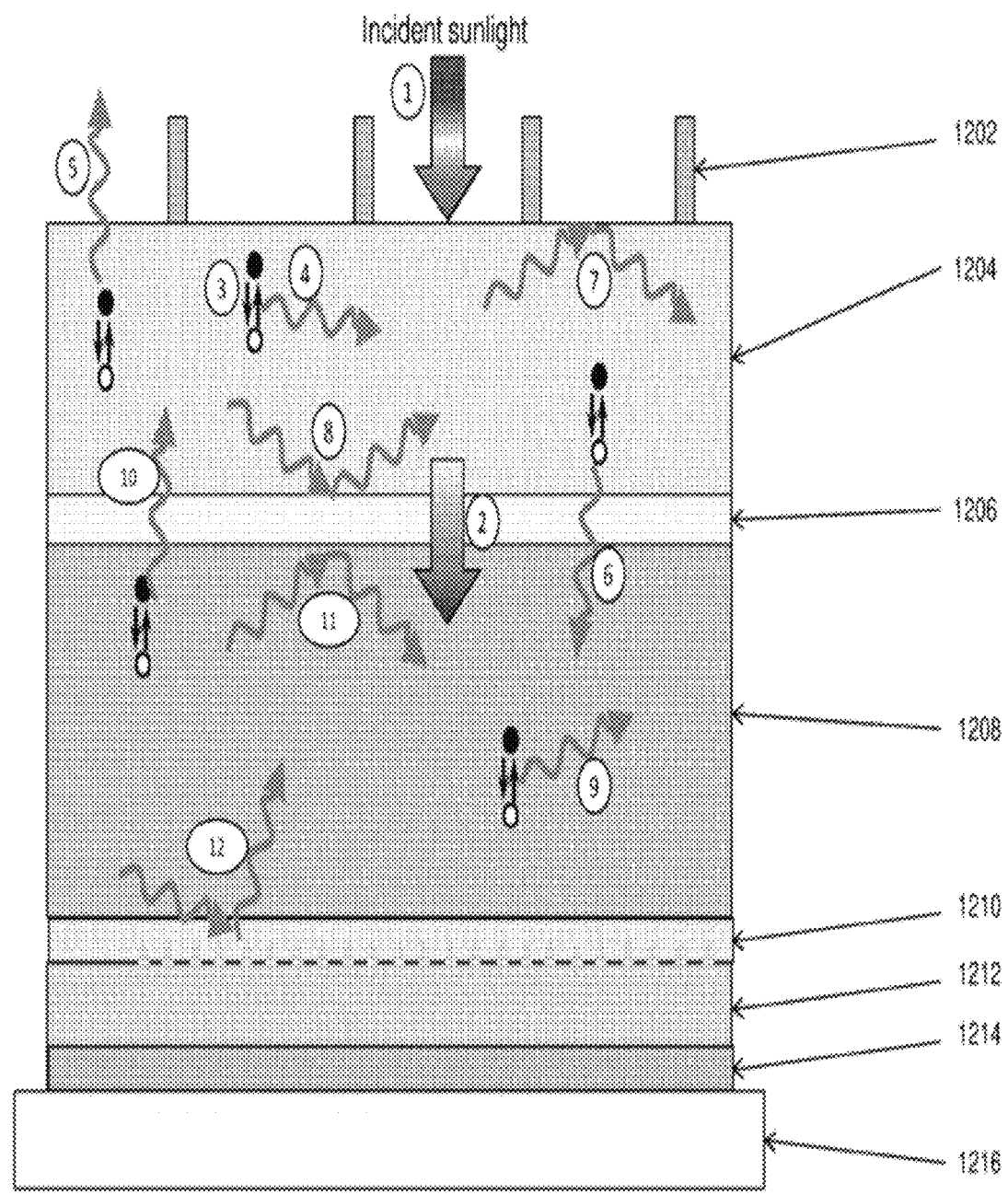
FIG. 5 illustrates the photon recycling operation in a multi junction optoelectronic device.

To describe the operation of a multi junction optoelectronic device in more detail refer now to the following discussion in conjunction with the accompanying FIG. 5.

FIG. 5 illustrates the photon recycling operation in a multi junction optoelectronic device 1200. The device 1200 is a simplified version of device 1100 of FIG. 3. The device 1200 includes a top cell 1204 and a bottom cell 1208. A tunnel junction 1206 is located between the top cell 1204 and the bottom cell 1208. A first metal layer 1202 is coupled to the top cell 1204 and a textured reflector layer 1210 is underneath the bottom cell 1208. A dielectric layer 1212 is located under the textured reflector layer 1210. A second metal layer 1214 is located under the dielectric layer 1212. Finally, a backing material 1216 is under the second metal layer 1214.

In the multi junction optoelectronic device 1200, incident sunlight is provided as shown by arrow 1. As is well understood, sunlight has multiple wavelengths, many of which will be absorbed by the top cell 1204. However, the wavelengths that are not absorbed by the top cell 1204 will enter the bottom cell 1208 as indicated by arrow 2. In an embodiment, the top cell 1204 has a higher energy than the bottom cell 1208. In principle, if the material and quality is fine enough, a large density of these photons can be generated at the wavelength specified by the bandgap of the material, in both the top and bottom cells 1204 and 1208.

Arrows 4-12 represent photons that are present within the device 1200 during operation of the device 1200. The photon recycling operation will be described in more detail herein below. The photons represented by arrows 4 and 9 are a typical radiative recombination, so the incident sunlight generates an electron hole 3, and an electrical current is generated therefrom defined by the bandgap of the top cell 1204 or bottom cell 1208. As is seen, photons as represented by arrows 5 and 10 result from electron hole recombination, proceed out of the top cell 1204 and bottom cell 1208, respectively. Photons can also reflect off the top and of the bottom surfaces of the top and bottom cells 1204 and 1208 as the photons represented by arrows 7,8,11 and 12, respectively. The photon represented by arrow 12 is reflected by the textured reflector layer 1210 such that the angle of incidence of the reflector 1210 causes the photon to be reflected in a different angle.

The photon represented by arrow 7 shows light that hits the top cell 1204 first but, unlike the photon represented by arrow 5, the photons represented by arrow 7 is trapped by the total internal reflection caused by the refractive index contrast between the top cell 1204 and the air. The photon represented by arrow 8 shows a similar phenomenon at the back side of the cell 1204. The tunnel junction 1206 could, in principle, have maximum reflectivity for light at the bandgap wavelength of the top cell 1204. If some additional factor is not added, the photons represented by arrows 8 and 11 are going to be fairly weak, because there is not much reflectivity off of the tunnel junction 1206.

Therefore, the tunnel junction 1206 must be thin and with a high bandgap, as transparent as possible, so that as little light is lost to the tunnel junction 1206 as possible, in which case the photon represented by arrow 6 can go through to the bottom cell 1208. Therefore the photon represented by arrow 6 would be absorbed because it has a higher energy than the bandgap energy of the bottom cell 1208. In other words, recombination that results in a photon represented by arrow 6 is not wasted, even though it is not generating current in the top cell 1204, because it sends current to the bottom cell 1208.

In a system in accordance with the present disclosure, one or more optical filters can be inserted into the tunnel junction 1206 of the multi junction photovoltaic device 1200 or added on top of tunnel junction 1206. The one or more optical filters are specific to the angle and wavelength of the light, such that each of them are engineered to reflect photons with energy greater than the bandgap energy of the p-n junction material below it, while at the same time transmitting photons of lower energy.

The one or more optical filters may be implemented as a part of the deposition process of the active material, such as during the epitaxial growth process. This may consist of multiple thin layers of compatible materials with different refractive indexes, all with band gaps above the upper junction to avoid absorption of relevant light. The contrast in the refractive index may be combined with specific layer thickness so that the structure is anti-reflective at the normal angle through destructive interference of the reflected light over a relative broad wavelength range in order to allow the transmission of the incident light. The reflections are made constructive when the light is sufficiently away from the normal angle beyond the total-internal-reflection escape cone angle of the optoelectronic device at the wavelength of the band gap of the upper junction, so that photon recycling is obtained. In addition, total internal reflection from the filter layers can also be used to enhance the reflection of off-normal light.

Ideally the recycled photons of the top cell 1204 will stay inside the top cell 1204, because they provide higher energy if the photons are in the top cell 1204. At the same time, the lower energy photons still need to get through. This is because the top cell 1204 is more or less transparent to the recycled photons of the bottom cell 1208. Depending on what angle the light is coming out, it is possible to lose the recycled photons. Also, ideally the recycled photons of the bottom cell 1208 will stay inside of the bottom cell 1208.

One problem with the light trapping is that if the cell 1208 is too thin, the incident light from the large arrows 1 and 2 will largely just bounce straight back off the reflector 1210 and straight back out the front of the cell 1208. The textured reflection layer or light-scattering layer 1210 of this embodiment can be utilized so that the light can be bounced sideways into the cell 1208 as opposed to bouncing straight back out of the front of cell 1208.

One of ordinary skill in the art readily recognizes a variety of materials listed could differ from the examples listed herein. Furthermore, the p-n junction formed in structure could be a homojunction or a heterojunction, that is, both the n-layer and p-layer could be the same material, or could be different materials, and that would be within the spirit and scope of the present disclosure. Also the doping could be inverted, with p-type material at the top of the device, facing the sun, and n-type material at the bottom. One or more additional p-n structures could be added to the structure in a similar fashion, either above or below structure, and possibly coupled to the rest of the device through a tunnel junction layer or layers.

Details regarding the various implementations described in FIGS. 6A-7E are provided below. Each of these implementations may rely on the techniques, features, structures, and configurations described above in connection with FIGS. 1-5. That is, the information provided above in FIGS. 1-5 regarding the composition (e.g., type of material), doping, thickness, and/or placement of certain epitaxially grown or deposited layers or structures can also apply to the same or similar layers or structures described in FIGS. 6A-7E. For example, implementations regarding p-n layers, window layers, reflectors, contacts, textured layers, ARC layers, filter layers, and/or junctions described above in connection with FIGS. 1-5 can also apply to the same or similar layers or structures described in FIGS. 6A-7E.

Figure 6A:
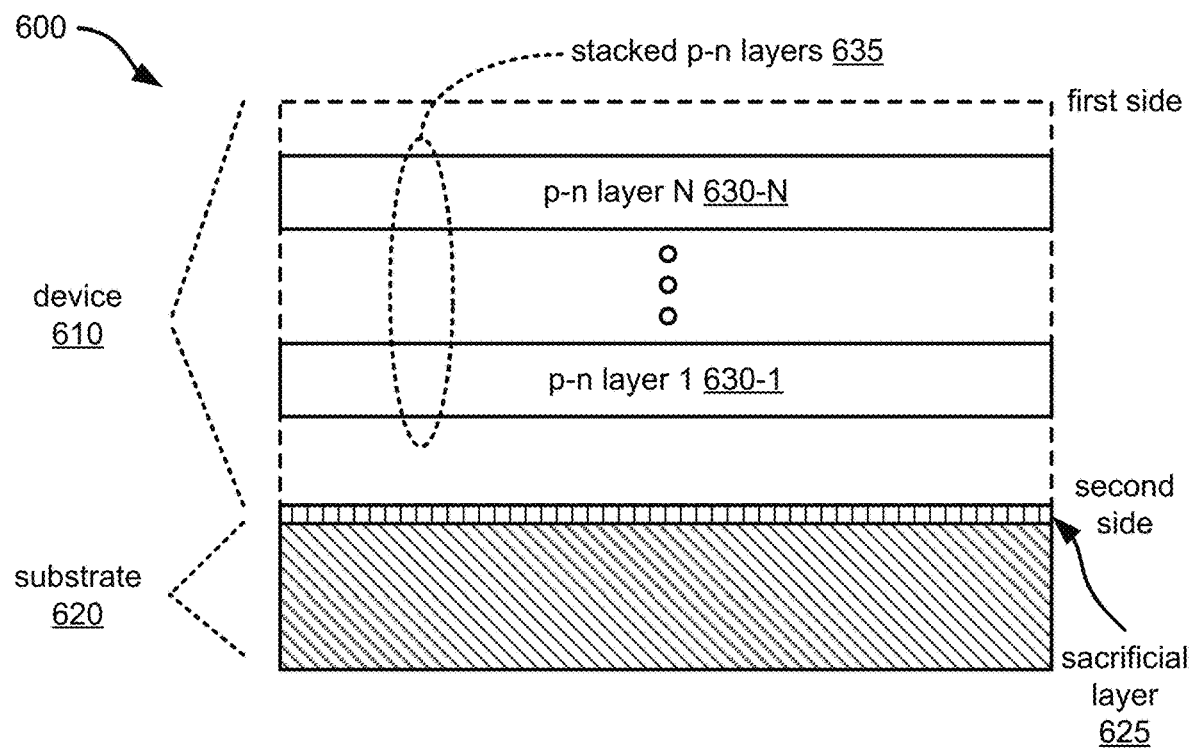
FIGS. 6A and 6B are diagrams that illustrate examples of a multi junction optoelectronic device epitaxially grown on a substrate.

FIG. 6A shows a diagram 600 in which a device 610 (e.g., an optoelectronic semiconductor device, a multi junction optoelectronic device, or simply a multi junction device) is epitaxially grown on a substrate 620. The device 610 may be optionally grown on a sacrificial layer 625 that is itself grown or deposited over the substrate 620. The device 610 includes a first side and a second side (as shown), where the second side is the side closest to the substrate, and where the device 610 is configured to receive light at the second side (once the device 610 is removed or separated from the substrate 620) when that side is exposed to a light source.

The device 610 can include multiple p-n layers 630, which can be stacked as illustrated by the stacked p-n layers 635. As used herein, multiple p-n layers, multiple stacked p-n layers, stacked p-n layers, and a plurality of stacked p-n layer can all refer to having two or more p-n layers 630 stacked over each other. Moreover, as described herein, the stacking of p-n layers 630 can refer to a continuous stacking of p-n layers 630 or a discontinuous stacking of p-n layers 630 when other layers are grown in between p-n layers 630. In this example, the stacked p-n layers 635 can include two or more p-n layers 630 such as p-n layer 630-1, p-n layer 630-N, and possibly more p-n layers 630.

Each of the p-n layers 630 in the stacked p-n layers 635 includes a p-doped layer and an n-doped layer (not shown), with a p-n junction formed between the p-doped layer and the n-doped layer such that at least one the p-n layers 630 in the stacked p-n layers 635 generates electrical energy when photons are absorbed by that p-n layer in response to the device 610 being exposed to a light source on the second side. Each p-n layer 630 has a first side and a second side, and the first side of each p-n layer 630 being closer than its second side to the first side of the device. In an aspect, each p-n layer 630 in the stacked p-n layers 635 can have a certain polarity and such implementation can be changed by having the polarity in each p-n layer 630 of the stacked p-n layers 635 reversed.

When growing the stacked p-n layers 635, one or more filter layers can be formed that act as optical filters between two or more of the p-n layers 630, such that when the second side of the device 610 is exposed to a light source, each of the one or more filter layers is engineered or configured to reflect photons with energy greater than or equal to the bandgap energy of the p-n layers 630 between that filter layer and the second side of the device, and concurrently transmit photons with energy lower than the bandgap energy of the p-n layers 630 between that filter layer and the second side of the device. Additional details regarding the use of filter layers that act, operate, or function as optical filters in a device such as the device 610 are provided in connection with FIG. 6. As such, the embodiments and techniques described in FIG. 6 can be applied to the use of filter layers or optical filters in the stacked p-n layers 635 of the device 610.

When growing the stacked p-n layers 635, a heterojunction can be formed within at least one of the p-n layers 630 of the stacked p-n layers 635. In an aspect, the heterojunction is offset from its corresponding p-n junction. In another aspect, the heterojunction can be within two depletion lengths of its corresponding p-n junction. Details regarding the formation and location of a heterojunction in a device such as the device 610 are provided above at least in connection with FIG. 4. As such, the embodiments and techniques described in FIG. 4 can be applied to the use of one or more heterojunctions in the stacked p-n layers 635 of the device 610.

Figure 6B:
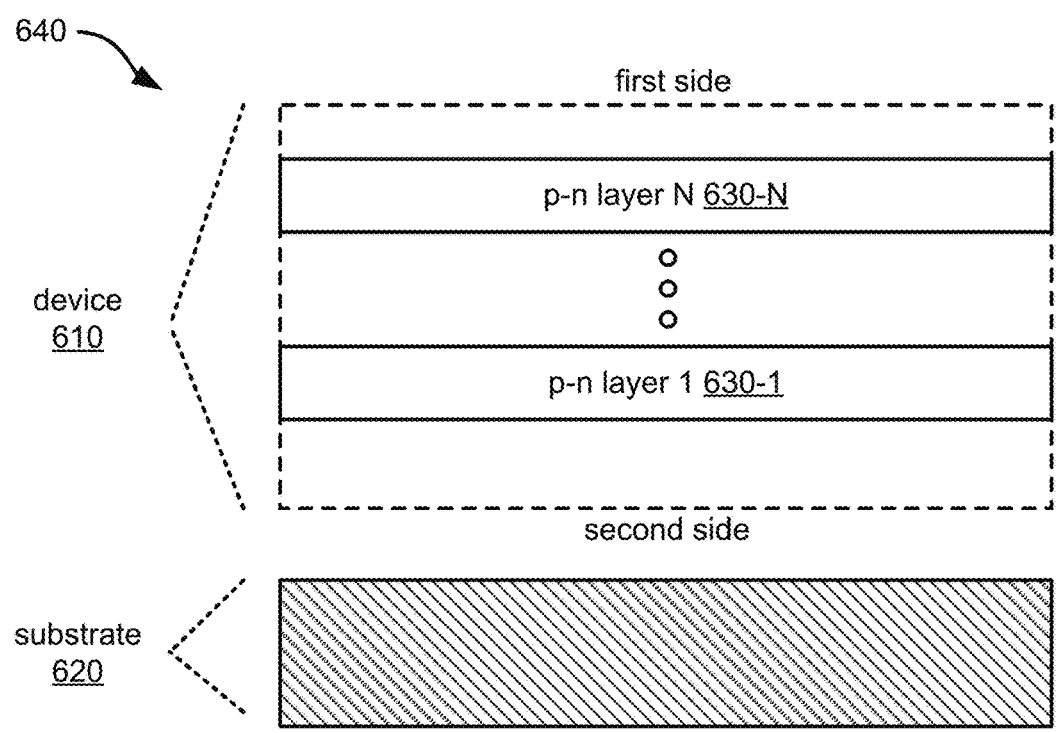

FIG. 6B shows a diagram 640 in which the device 610 is removed, separated, or isolated from the substrate 620. The removal of the device 610 can be done through a lift off process such as an ELO process in which the sacrificial layer 625 is removed. In an aspect, the sacrificial layer 625 is an aluminum-containing layer, and the device 610 is separated from the substrate 620 by etching the aluminum-containing layer using a liquid containing one or more acids. In an example, the aluminum-containing layer is an aluminum arsenide (AlAs) layer, and the one or more acids include hydrofluoric acid (HF).

Figure 7A:
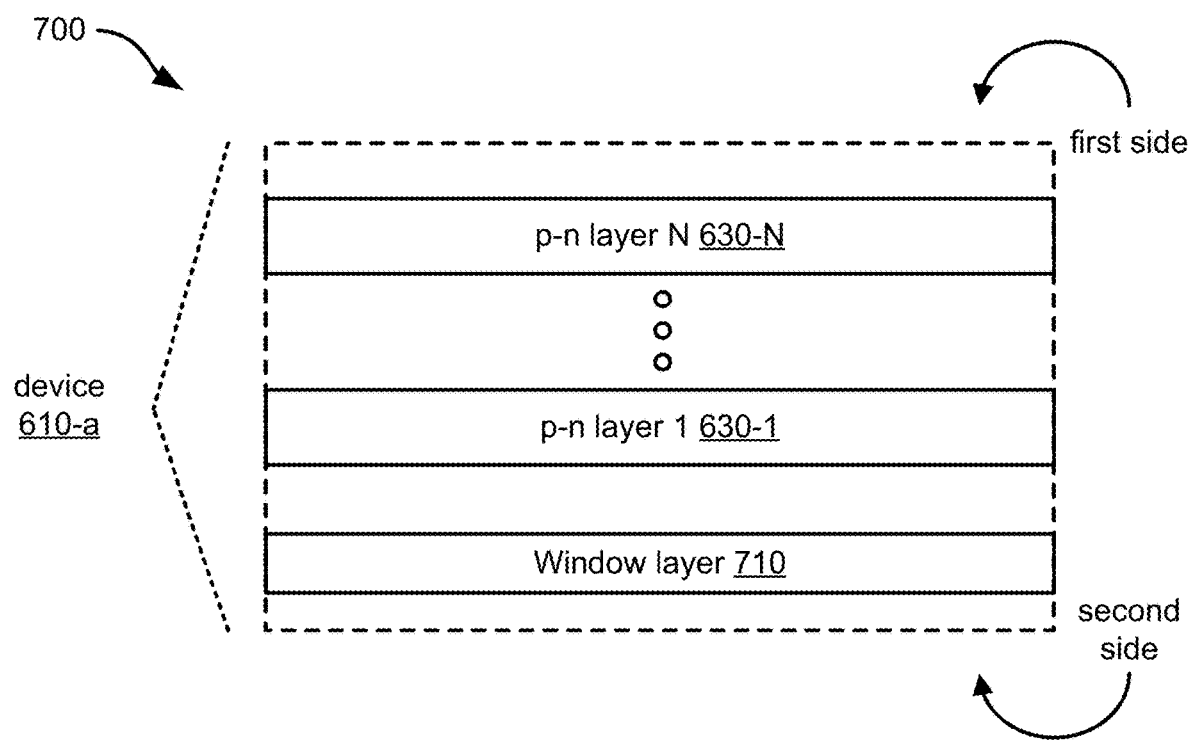
FIGS. 7A-7F are diagrams that illustrate various structural examples of a multi-junction optoelectronic device.

FIG. 7A shows a diagram 700 in which a device 610-a has been grown and removed from a substrate (e.g., the substrate 620) through an epitaxial lift off process (e.g., ELO process). The device 610-a, in addition to including the p-n layers 630-1, . . . , 630-N, can also include a window layer 710 closest to the second side of the device 610-a and formed during the growth or formation of the device 610-a. In an aspect, the window layer 710 can be adjacent to the second side of the device 610-a or can be separated (as shown) from the second side of the device 610-a by one or more epitaxially grown layers (not shown). Similarly, the window layer 710 can be adjacent to the stacked p-n layers 635 (in this case adjacent to p-n layer 630-1) or can be separated (as shown) from the stacked p-n layers 635 by one or more epitaxially grown layers (not shown).

Figure 7B:
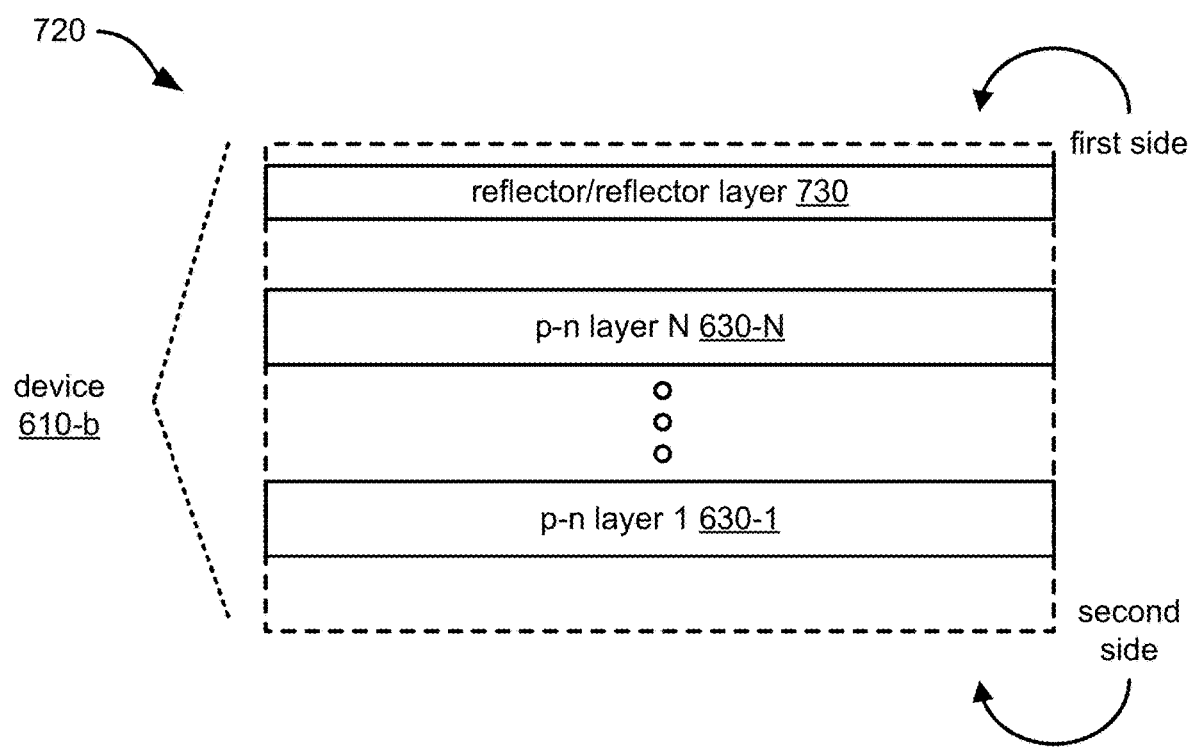

FIG. 7B shows a diagram 720 in which a device 610-b has been grown and removed from a substrate (e.g., the substrate 620) through an epitaxial lift off process (e.g., ELO process). The device 610-b, in addition to including the p-n layers 630-1, . . . , 630-N, can also include a reflector layer or reflector 730 closest to the first side of the device 610-b and formed during the growth or formation of the device 610-b. In an aspect, the reflector 730 can be adjacent to the first side of the device 610-b or can be separated (as shown) from the first side of the device 610-b by one or more epitaxially grown layers (not shown). Similarly, the reflector 730 can be adjacent to the stacked p-n layers 635 (in this case adjacent to p-n layer 630-N) or can be separated (as shown) from the stacked p-n layers 635 by one or more epitaxially grown layers (not shown). In another aspect, the reflector 730 can be configured to have reflectivity such that light trapping, leading to enhanced photon recycling, is enabled and the performance including the open circuit voltage of the device is enhanced. For example, the reflector 730 is configured to provide for photons to be redirected to the stacked p-n layers 635 to be absorbed and converted into electrical energy. In one example, the reflector 730 is a dielectric reflector. Additionally or alternatively, the reflector 730 is a textured reflector. Details regarding the formation and location of a reflector in a device such as the device 610-*b* are provided above at least in connection with, for example, the reflector in FIG. 3. As such, the embodiments and techniques described in FIG. 3 can be applied to the use of a reflector in the device 610-*b*.

Figure 7C:
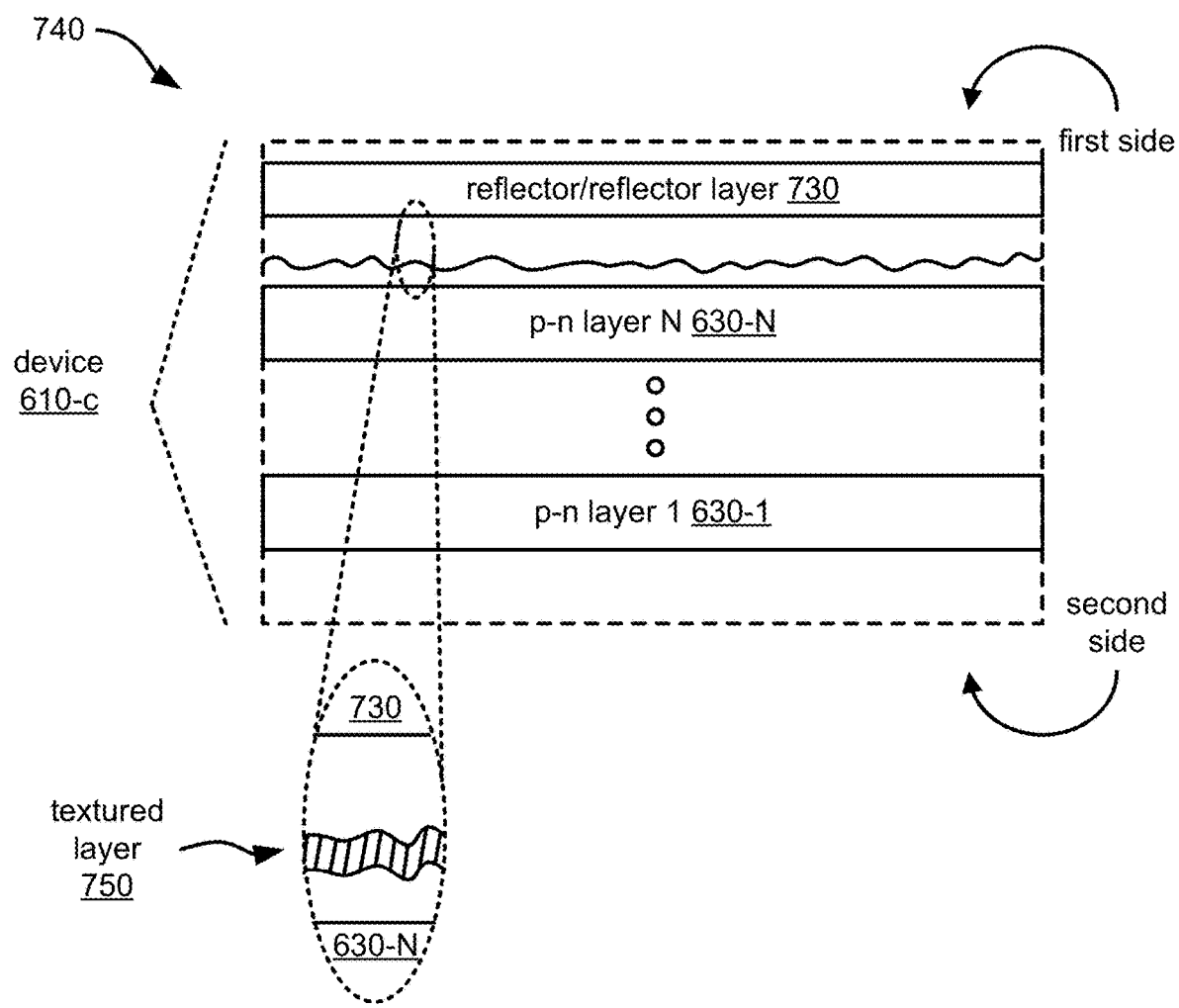

FIG. 7C shows a diagram 740 in which a device 610-*c* has been grown and removed from a substrate (e.g., the substrate 620) through an epitaxial lift off process (e.g., ELO process). The device 610-*c*, in addition to including the p-n layers 630-1, . . . , 630-N, and the reflector 730, can also include a textured layer 750 between the reflector 730 and the stacked p-n layers 635 (in this case p-n layer 630-N). In an aspect, the textured layer 750 can be adjacent to the stacked p-n layers 635 or closer to the stacked p-n layers 635 than to the reflector 730. Details regarding the formation and location of a textured layer in a device such as the device 610-*c* are provided above at least in connection with, for example, the textured layer 1121 in FIG. 3. As such, the embodiments and techniques described in FIG. 3 can be applied to the use of one or more textured layers 750 in the device 610-*c*.

Figure 7D:
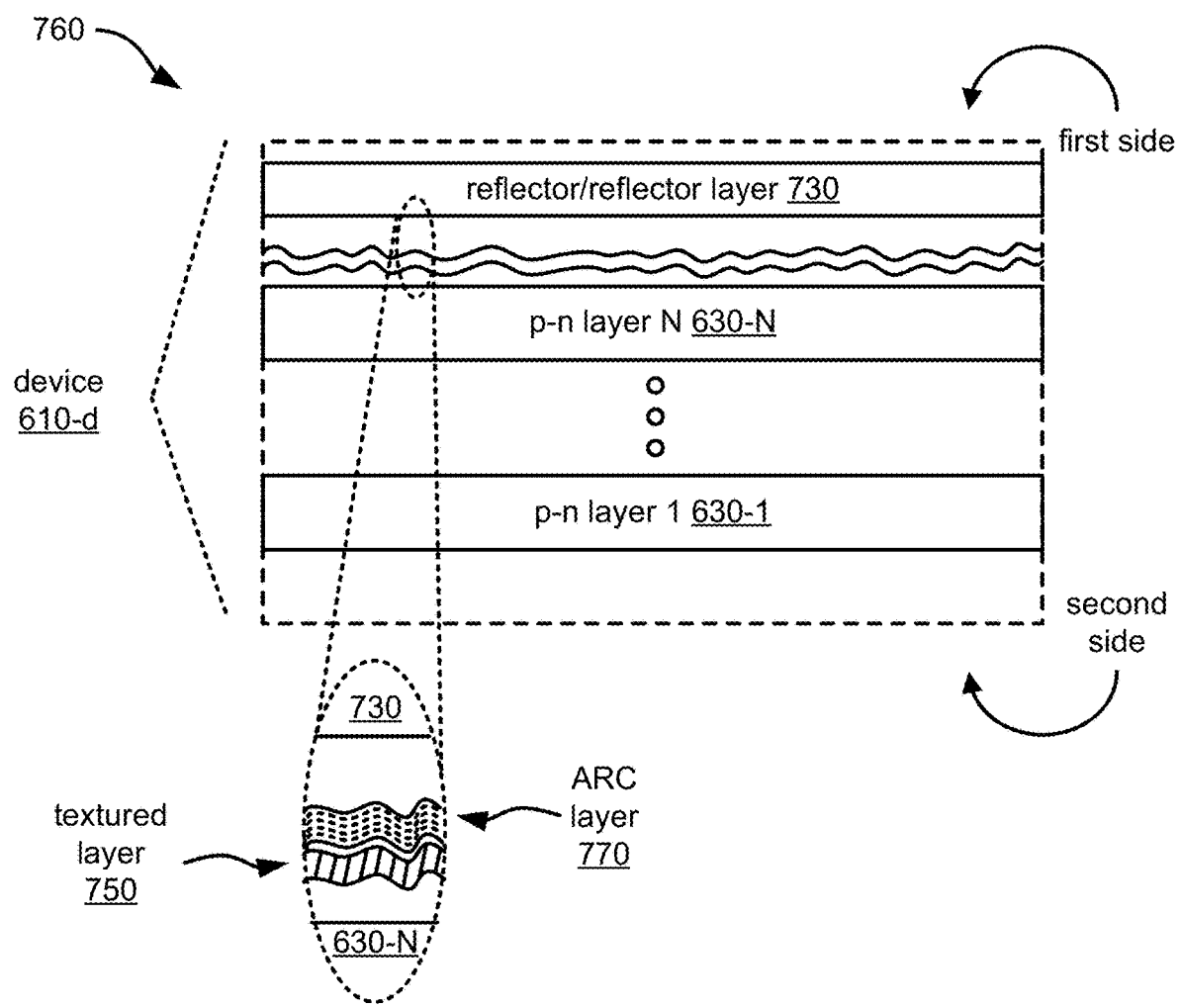

FIG. 7D shows a diagram 760 in which a device 610-*d* has been grown and removed from a substrate (e.g., the substrate 620) through an epitaxial lift off process (e.g., ELO process). The device 610-*d*, in addition to including the p-n layers 630-1, . . . , 630-N, the reflector 730, and textured layer 750, can also include an ARC or ARC layer 770 between the reflector 730 and the textured layer 750. In an aspect, the ARC layer 770 can be adjacent to or close to the textured layer 750. Moreover, the ARC layer 770 can have a texture consistent with (e.g., follows or mimics) a texture of the textured layer 750. Details regarding the formation and location of an ARC in a device such as the device 610-*d* are provided above at least in connection with, for example, the ARC 1120 in FIG. 3. As such, the embodiments and techniques described in FIG. 3 can be applied to the use of one or more ARC or ARC layers 770 in the device 610-*d*.

Figure 7E:
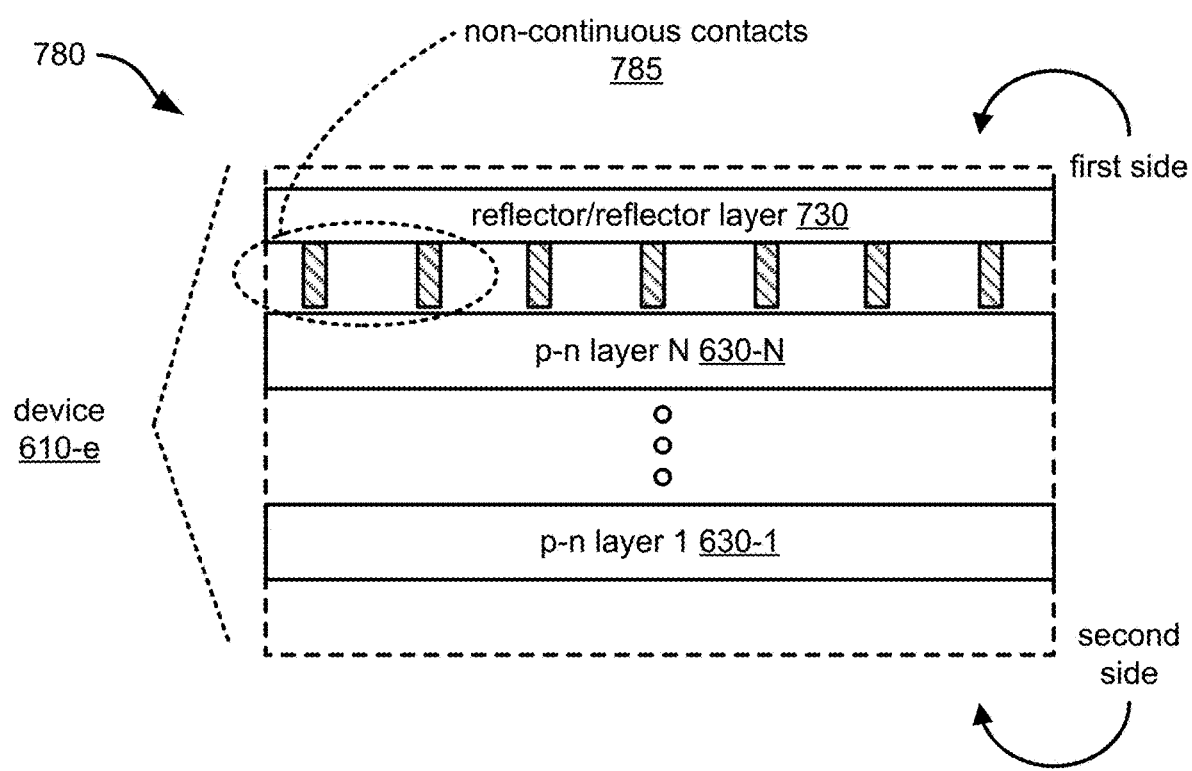

FIG. 7E shows a diagram 780 in which a device 610-*e* has been grown and removed from a substrate (e.g., the substrate 620) through an epitaxial lift off process (e.g., ELO process). The device 610-*e*, in addition to including the p-n layers 630-1, . . . , 630-N, can also include multiple non-continuous contacts 785 between the reflector 730 and the stacked p-n layers 635 (in this case the p-n layer N). In an aspect, the non-continuous contacts 785 can be in physical and/or electrical contact with the reflector 730. Details regarding the formation and location of non-continuous contacts in a device such as the device 610-*e* are provided above at least in connection with, for example, the non-continuous contacts 1115*a*-1115*n* in FIG. 3. As such, the embodiments and techniques described in FIG. 3 can be applied to the use of one or more non-continuous contacts 785 in the device 610-*e*.

Figure 7F:
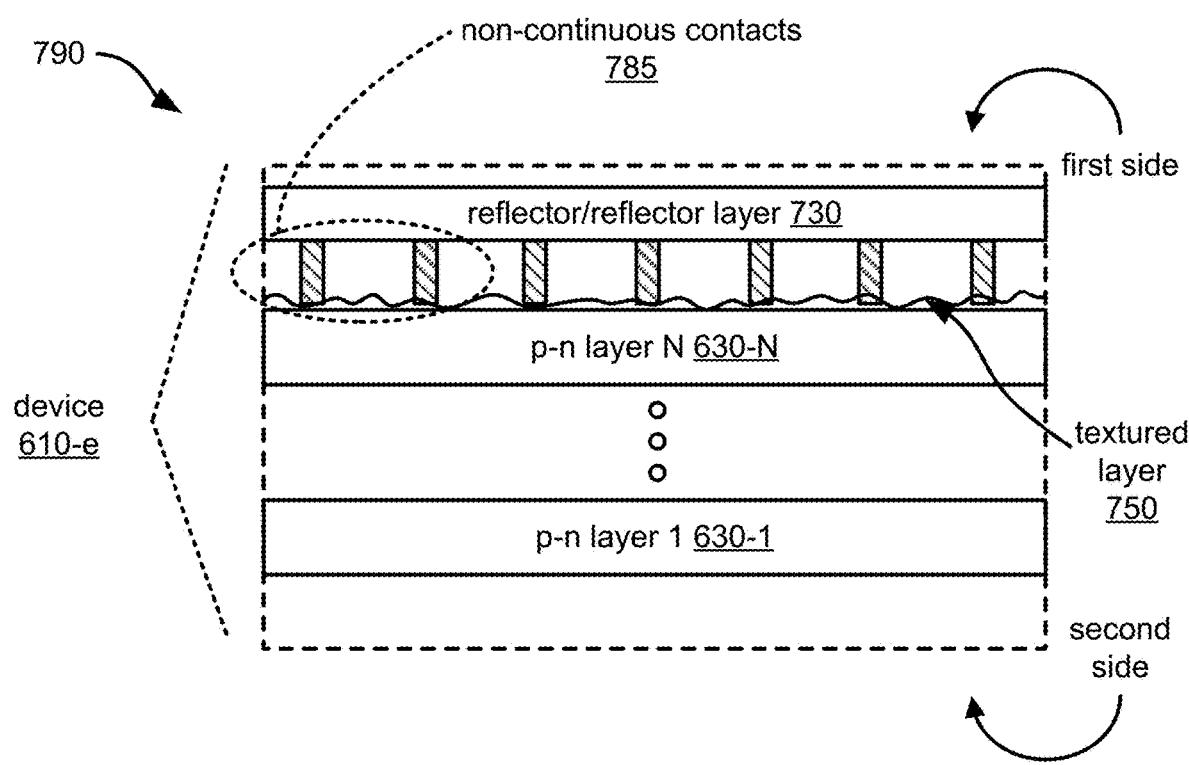

FIG. 7F shows a diagram 790 in which a device 610-*f* has been grown and removed from a substrate (e.g., the substrate 620) through an epitaxial lift off process (e.g., ELO process). The device 610-*f*, in addition to including the p-n layers 630-1, . . . , 630-N, and the non-continuous contacts 785, can also include the textured layer 750. In an aspect, the non-continuous contacts 785 can be in physical and/or electrical contact with the textured layer 750. Additionally, the device 610-*f* can also include the ARC layer 770 such that both the textured layer 750 and the ARC layer 770 are present along with the non-continuous contacts 785. Details regarding the formation and location of non-continuous contacts and a textured layer in a device such as the device 610-*f* are provided above at least in connection with, for example, FIG. 3. As such, the embodiments and techniques described in FIG. 3 can be applied to the use of one or more non-continuous contacts 785 and the textured layer 750 in the device 610-*f*.

While feature(s) in FIGS. 6A-7F may have been shown in connection with a particular implementation, it is to be understood that the feature(s) in one implementation can be combined with feature(s) in another implementation. For example, the non-continuous contacts 785 in FIGS. 7E and 7F can be used in any of the devices 610, 610-*a*, 610-*b*, and 610-*d*. In another example, the window layer 710 in FIG. 7A can be used in any of the devices 610, 610-*b*, 610-*c*, 610-*d*, 610-*e*, and 610-*f*. Similarly for the textured layer 750, the ARC layer 770, and any filter layers, where each of these layers can be used with any one of the implementations described above.

FIG. 8 shows a flowchart that illustrates a method 800 for fabricating a device such as an optoelectronic semiconductor device, a multi junction optoelectronic device, or simply a multi junction device.

At block 810, the method 800 includes epitaxially growing the device on a substrate, the device having a first side and a second side closer to the substrate, the device being configured to receive light at the second side of the device. In an example, the device can be any of the devices described in FIGS. 6A-7F.

As part of block 810, at block 815, the epitaxial growing of the device can include epitaxially growing multiple, stacked p-n layers (e.g., the p-n layers 630 in the stacked p-n layers 635 as illustrated in FIG. 6A) between the first side and the second side of the device. Each of the stacked p-n layers (e.g., each p-n layer 630) can include a p-doped layer and an n-doped layer, with a p-n junction formed between the p-doped layer and the n-doped layer such that at least one of the stacked p-n layers generates electrical energy when photons are absorbed by that p-n layer in response to the device being exposed to a light source on the second side of the device, and each p-n layer having a first side and a second side, and the first side of each p-n layer being closer than its second side to the first side of the device.

As part of block 815, at block 820, the epitaxial growing of the stacked p-n layers can further include epitaxially growing a window layer (e.g., the window layer 710).

As part of block 815, at block 825, the epitaxial growing of the stacked p-n layers can further include depositing a reflector (e.g., the reflector 730) closer to the first side of the device than to the multiple stacked p-n layers, where the reflector provides for photons to be redirected to the stacked p-n layers to be absorbed and converted into electrical energy. Moreover, the reflector can be configured to have reflectivity such that light trapping, leading to enhanced photon recycling, is enabled and the performance including the open circuit voltage of the device is enhanced. In an aspect, the depositing of the reflector can include depositing a dielectric reflector. Additionally or alternatively, the depositing of the reflector can include depositing a textured reflector.

As part of block 825, at block 830, the depositing of the reflector can further include depositing a textured layer (e.g., textured layer 750) between the multiple, stacked p-n layers and the reflector.

As part of block 830, at block 835, the depositing of the textured layer can further include depositing an antireflective coating (ARC) (e.g., ARC layer 770) over the textured layer, where the ARC layer can have a texture consistent with a texture of the textured layer.

As part of block 825, at block 840, the deposing of the reflector layer can further include forming multiple non-continuous contacts (e.g., non-continuous contact 785) closer to the first side of the device than to the second side of the device, and between the stacked p-n layers and the reflector. In an aspect, a textured layer can be deposited between the stacked p-n layers and the reflector, where the non-continuous contacts can be in physical contact with the textured layer.

As part of block 810, at block 850, the epitaxially growing the device can further include epitaxially growing the device over a sacrificial layer (e.g., the sacrificial layer 625) deposited over the substrate.

At block 860, the method 800 can include removing the device from the substrate using a lift off process (as illustrated in FIG. 6B).

As part of the block 860, at block 870, the removing of the device from the substrate can include separating the device from the substrate by removing a sacrificial layer (e.g., the sacrificial layer 625).

In another aspect of the method 800, growing the stacked p-n layers can include forming a heterojunction within at least one of the stacked p-n layers. The heterojunction can be offset from its corresponding p-n junction. Moreover, the heterojunction can be within two depletion lengths of its corresponding p-n junction.

In another aspect of the method 800, growing the stacked p-n layers can include forming one or more filter layers that act as optical filters between two or more of the stacked p-n layers, such that when the second side of the device is exposed to a light source, each of the one or more filter layers is engineered to reflect photons with energy greater than or equal to the bandgap energy of the p-n layers between that filter layer and the second side of the device, and concurrently transmit photons with energy lower than the bandgap energy of the p-n layers between that filter layer and the second side of the device.

While the foregoing is directed to embodiments of the disclosures, other and further embodiments of the disclosures may be devised without departing from the basic scope thereof, and the scope thereof is determined by the claims that follow. Accordingly, the figures are intended to be illustrative rather than definitive or limiting. In particular many design elements could change, including but not limited to: the optoelectronic device could be p-on-n rather than n-on-p, the structure could include more than two junctions, the optoelectronic device could be a homojunction, the tunnel junctions could be made of GaAs or InGaP or other material, other layers within the cell could be exchanged with different materials, e.g. AlGaAs or AlGaInP instead of AlInP, etc., and the reflector could be purely metal as well as a dielectric plus metal.

Although the present disclosure has been described in accordance with the embodiments shown, one of ordinary skill in the art will readily recognize that there could be variations to the embodiments and those variations would be within the spirit and scope of the present disclosure. Accordingly, many modifications may be made by one of ordinary skill in the art without departing from the spirit and scope of the appended claims.

What is claimed is:

1. A method for fabricating a device, comprising:
    epitaxially growing a portion of the device on a substrate, the device having a first side and a second side closer to the substrate, the device being configured to receive light at the second side of the device, wherein epitaxially growing the portion of the device includes epitaxially growing a plurality of stacked p-n layers between the first side and the second side of the device, each of the plurality of stacked p-n layers comprising a p-doped layer and an n-doped layer, with a p-n junction formed between the p-doped layer and the n-doped layer such that at least one of the plurality of stacked p-n layers generates electrical energy when photons are absorbed by that p-n layer in response to the device being exposed to a light source on the second side of the device, and each p-n layer having a first side and a second side, and the first side of each p-n layer being closer than its second side to the first side of the device;
    depositing a reflector closer to the first side of the device than the plurality of stacked p-n layers, which provides for photons to be redirected to the plurality of stacked p-n layers to be absorbed and converted into electrical energy;
    forming a plurality of non-continuous contacts closer to the first side of the device than to the second side of the device and between the plurality of stacked p-n layers and the reflector; and
    removing the device with the plurality of stacked p-n layers, the plurality of non-continuous contacts, and the reflector from the substrate using a lift off process.

2. The method of claim 1, wherein the device is an optoelectronic semiconductor device.

3. The method of claim 1, wherein depositing the reflector comprises depositing a dielectric reflector.

4. The method of claim 1, wherein depositing the reflector comprises depositing a textured reflector.

5. The method of claim 1, wherein the reflector has reflectivity such that light trapping, leading to enhanced photon recycling, is enabled and the performance including the open circuit voltage of the device is enhanced.

6. The method of claim 1, wherein the polarity of each of the plurality of stacked p-n layers is reversed.

7. The method of claim 1, wherein:
    epitaxially growing the portion of the device on the substrate further includes epitaxially growing the portion of the device over a sacrificial layer deposited over the substrate, and
    removing the device from the substrate using the lift off process includes separating the device from the substrate by removing the sacrificial layer.

8. The method of claim 7, wherein the liftoff process that includes separating the device from the substrate by removing the sacrificial layer is an epitaxial liftoff (ELO) process.

9. The method of claim 8, wherein:
    the sacrificial layer is an aluminum-containing layer, and
    the separating the device from the substrate by removing the sacrificial layer includes etching the aluminum-containing layer using a liquid containing one or more acids.

10. The method of claim 9, wherein:
    the aluminum-containing layer is an aluminum arsenide (AlAs) layer, and
    the one or more acids include hydrofluoric acid (HF).

11. The method of claim 1, wherein epitaxially growing the plurality of stacked p-n layers includes forming a heterojunction within at least one of the plurality of stacked p-n layers.

12. The method of claim 11, wherein the heterojunction is offset from its corresponding p-n junction.

13. The method of claim 12, wherein the heterojunction is within two depletion lengths of its corresponding p-n junction.

14. The method of claim 1, wherein epitaxially growing the plurality of stacked p-n layers includes forming one or more filter layers that act as optical filters between two or more of the plurality of stacked p-n layers, such that when the second side of the device is exposed to the light source, each of the one or more filter layers is engineered to:
- reflect photons with energy greater than or equal to the bandgap energy of the p-n layers between that filter layer and the second side of the device, and
- concurrently transmit photons with energy lower than the bandgap energy of the p-n layers between that filter layer and the second side of the device.

* * * * *